(12) United States Patent
Inukai

(10) Patent No.: US 7,038,674 B2
(45) Date of Patent: May 2, 2006

(54) DISPLAY DEVICE AND METHOD FOR DRIVING THE SAME

(75) Inventor: Kazutaka Inukai, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 417 days.

(21) Appl. No.: 10/253,519

(22) Filed: Sep. 25, 2002

(65) Prior Publication Data

US 2003/0063054 A1    Apr. 3, 2003

(30) Foreign Application Priority Data

Sep. 28, 2001    (JP)    ............... 2001-304494

(51) Int. Cl.
  *G09G 3/30*    (2006.01)
  *G09G 3/32*    (2006.01)
  *G09G 5/00*    (2006.01)

(52) U.S. Cl. ..................... 345/211; 345/76; 345/83

(58) Field of Classification Search ........... 345/76–83, 345/87–96, 204–207, 208–214, 690, 694–699
See application file for complete search history.

(56) References Cited

U.S. PATENT DOCUMENTS

| 6,335,716 B1 | 1/2002 | Yamazaki et al. |
| 6,597,014 B1 | 7/2003 | Yamazaki et al. |
| 6,667,494 B1 | 12/2003 | Yamazaki et al. |
| 6,670,635 B1 | 12/2003 | Yamazaki et al. |
| 6,717,179 B1 | 4/2004 | Yamazaki et al. |
| 6,909,411 B1 | 6/2005 | Yamazaki et al. |
| 6,917,368 B1* | 7/2005 | Credelle et al. ............ 345/589 |
| 2002/0063784 A1 | 5/2002 | Kitagawa |
| 2004/0174375 A1* | 9/2004 | Credelle et al. ............ 345/589 |
| 2005/0052369 A1* | 3/2005 | Tada ........................... 345/76 |

FOREIGN PATENT DOCUMENTS

JP    2001-092413    4/2001

* cited by examiner

Primary Examiner—Vijay Shankar
(74) Attorney, Agent, or Firm—Nixon Peabody LLP; Jeffrey L. Costellia

(57) ABSTRACT

In a display device which adopts the digital system for expressing gray scales in $2^k$ unit, when gamma correction is performed so as not to generate omissions in the gray scales and display suitable for human visibility is further performed, it has been necessary to output a bit number several times the bit number of perceived luminance scale to be outputted in original intention in the real luminance scale. The invention suppresses the gamma value in gamma correction to such values as low as 2.0 or below (preferably 1.6 to 1.8). In addition, the invention uses a display device allowing $2^k$ gray scale display ($n < k \leq 2n$) to perform $2^n - \alpha$ a gray scale display ($0 < \alpha < 2^n$, $\alpha$ is a natural number).

3 Claims, 15 Drawing Sheets

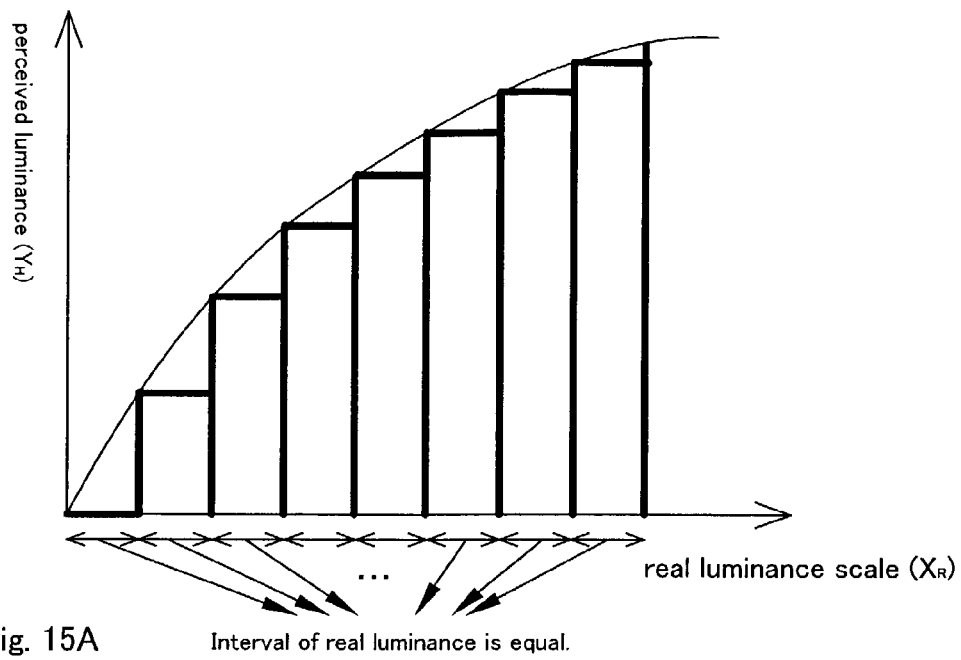
Fig. 15A  Interval of real luminance is equal.
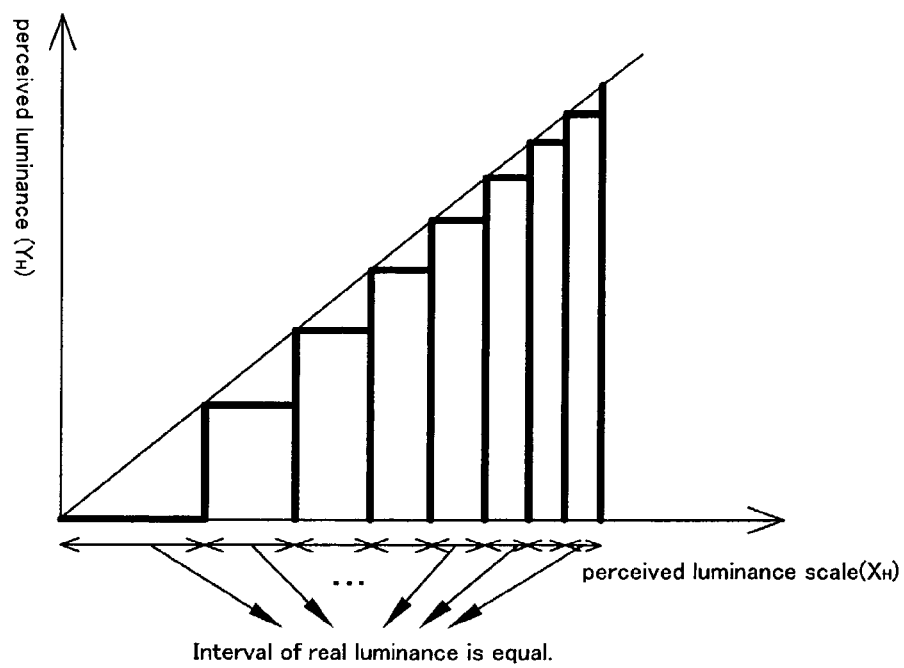
Fig. 15B  Interval of real luminance is equal.

DISPLAY DEVICE AND METHOD FOR DRIVING THE SAME

BACKGROUND OF THE INVENTION

The present invention relates to a display device having a gamma correction circuit and a method for driving the same. Particularly, the invention relates to a light emitting device having light emitting elements disposed on an insulating surface for displaying images with the light emitting elements and a method for driving the same. Additionally, the invention relates to an electronic device provided with the display device.

In recent years, the development of display devices for displaying images has been proceeding. In the display devices, there are a liquid crystal display device for displaying images with liquid crystal elements and a light emitting device for displaying images with light emitting elements such as an Organic Light Emitting Diode (OLED).

The gray scales of brightness of images to be displayed on the display device are expressed by luminance. Furthermore, the gray scales are used for two meanings: the real luminance scale defined by using the luminance as physical quantity expressed by a unit of cd/m$^2$ as a standard for equal split, and the perceived luminance scale defined by using the human visible perception property as a standard for equal split. Moreover, the gray scales are sometimes denoted by bit. In this case, for example, one bit expresses $2^1$=two levels of gray scale, three bits expresses $2^3$=eight levels of gray scale, and n bits expresses $2^n$ levels of gray scale.

FIGS. 12A to 12C are used to describe the relationship between the gray scales and the luminance. FIG. 12A depicts a graph in which the horizontal axis is the real luminance scale ($X_R$) and the vertical axis is the real luminance ($Y_R$). The real luminance scale ($X_R$) is directly proportional to the real luminance ($Y_R$), being a linear line ever increasing. The higher the real luminance scale ($X_R$) rises, the greater the real luminance ($Y_R$) becomes. In other words, the brightness becomes intense as the real luminance scale ($X_R$) rises higher.

FIG. 12B depicts a graph in which the horizontal axis is the real luminance scale ($X_R$) and the vertical axis is the perceived luminance ($Y_H$). In addition, FIG. 12C depicts a graph in which the horizontal axis is the perceived luminance scale ($X_H$) and the vertical axis is the real luminance ($Y_R$). As shown in FIGS. 12B and 12C, the visibility to the brightness of human becomes dull as the luminance becomes higher. Consequently, the gray scales are expressed as a curve as shown in FIG. 12B to human eyes, not the linear line directly proportional to the luminance.

Here, suppose the video signal (X) to be inputted to a display device is a type that is proportional to the perceived luminance. Then, suppose the display device is a type that performs the output (Y) of real luminance type. In this case, the display device is desired first to convert the video signal (X) into data type proportional to the real luminance. When the following Equation (1) is used for the conversion at this time, this conversion is called gamma correction. So-called inverse gamma correction and strict gamma correction are also called gamma correction, not specified particularly.

$$Y=X\gamma \quad (1)$$

Generally, when the display device such as a liquid crystal display device and a light emitting device is used to display images, a gamma correction circuit for the gamma correction is disposed to truly reproduce the images to human eyes. Gamma correction allows the relationship between the gray scale (X) of the video signal to be inputted to a display device and the luminance (Y) to be outputted (displayed) by the display device to be corrected to the optimal curve. Suppose X is the perceived luminance type and Y is the real luminance type, it is set to gamma=about 2.2 in general.

Here, the light emitting device for displaying images with the light emitting elements will be described in detail. In addition, the light emitting device is roughly classified into the passive type and the active type. The active light emitting device having a light emitting element and a TFT for controlling the light emitting element both disposed in each of pixels on a substrate will be described in detail.

As a driving method when images of multiple gray scales are displayed in the active light emitting device, an analogue gray scale system and a digital gray scale system are named. The difference between both systems is in the method for controlling light emitting elements in the states of the light emitting element to emit light and not to emit light. The analogue gray scale system is the system that controls the current carried thorough the light emitting element to obtain gray scales. The digital gray scale system is the system that the light emitting element is driven only by two states, the ON-state (the state that the luminance is nearly 100%) and the OFF-state (the state that the luminance is nearly 0%). However, the digital gray scale system can display only two levels of gray scale if nothing is done, thus being combined with another system to display the images of multiple levels of gray scale.

One system is that the digital gray scale system is combined with the area gray scale system. The area gray scale system is the system that a single pixel is split into a plurality of sub-pixels and each of the sub-pixels is controlled to emit light or not to emit light, whereby the gray scales are displayed by the total area emitting light inside the single pixel.

Another system is that the digital gray scale system is combined with the time gray scale system. The time gray scale system is the system that time for a light emitting element to emit light (time for a pixel to be lighted) is controlled to display the gray scales. More specifically, suppose a period of time for drawing images one time is one frame period. The one frame period is split into a plurality of subframe periods having different length to select the light emitting element to emit light or not to emit light during each of the subframe periods, whereby the difference in the length of time emitted within one frame period expresses the gray scales.

For example, when an image of eight levels of gray scale (equivalent to three bits) is displayed in the real luminance, one frame period is split into three subframe periods SF1 to SF3. Then, light emission or no light emission is selected in each of the subframe periods SF1 to SF3, whereby the lengths of the total light emitting time are utilized to express the eight levels of gray scales, 0%, 14%, 28%, 43%, 57%, 71%, 86% and 100% luminance. For example, when light emission is selected only in the subframe period SF1 and no light emission is selected in the other subframe period SF2 and SF3, the luminance is 57%. Additionally, when light emission is selected in the subframe periods SF1 and SF3 and no light emission is selected in the other subframe period SF2, the luminance is 71%. In this manner, the time gray scale system expresses the gray scales by the combination of light emission time expressed in $2^k$ unit. Furthermore, k is expressed in the range of $0 \leq k \leq n-1$, and $2^n$ expresses the greatest gray scale allowing display in a light emitting device.

However, the gray scales might have omissions in gamma correction in the light emitting device in which the digital gray scale system is adapted to express the gray scales by combining with the area gray scale system in $2^k$ unit (binary code), or to express the gray scales by combining with the time gray scale system. Here, the omission in gray scales will be described by FIGS. 15A and 15B.

FIG. 15A depicts a graph in which the horizontal axis is the real luminance scale ($X_R$) and the vertical axis is the perceived luminance ($Y_H$). FIG. 15B depicts a graph in which the horizontal axis is the perceived luminance scale ($X_R$) and the vertical axis is perceived luminance ($Y_H$).

The graphs shown in FIGS. 15A and 15B reveal that the changes in the perceived luminance corresponding to the levels of real luminance scale are generally gradual when the levels of real luminance scale are high. Additionally, when the levels of real luminance scale are low, the changes in the perceived luminance corresponding to the levels of real luminance scale become greater suddenly.

That is, since the low perceived luminance area has fewer levels of real luminance scale than the high perceived luminance area has, the lower perceived luminance area tends to have greater errors. Then, the levels of real luminance scale corresponding to the perceived luminance might not exist in the low perceived luminance area, and thus some gray scales cannot be expressed. In this manner, when the areas of real luminance scale corresponding to the perceived luminance do not exist, omissions are generated in the gray scales.

SUMMARY OF THE INVENTION

In the display device in which the digital gray scale system is adapted to express gray scales in $2^k$ unit, suppose gamma correction is performed not to generate omissions in the gray scales and the display matched with the human visibility is further performed. It has been necessary to output a bit number several times the bit number of perceived luminance scale to be outputted in original intention in the real luminance scale.

For example, as shown in a graph of FIG. 13, when gamma correction is performed at a gamma value of 2.2 generally used in outputting 16 levels of gray scale (equivalent to four bits) in the perceived luminance scale, 387 levels of gray scale of display performance is needed in the real luminance scale. More specifically, the display performance equivalent to nine bits is needed in the real luminance scale.

That is, to display an image of 16 levels of gray scale (equivalent to four bits) in the perceived luminance scale, it is necessary to be performed by a light emitting device capable of displaying an image of 256 levels of gray scale (equivalent to eight bits) in the real luminance scale. However, unnecessarily enhancing the display performance of display devices causes a problem that burdens such as costs and power consumption are incredibly hiked. In addition, the realization itself is very difficult in the present circumstances.

Then, the object of the invention is to provide a display device capable of preventing burdens such as costs and power consumption caused by enhancing the display performance of real luminance and preventing omissions from being generated in gray scales and a method for driving the same. Further object of the invention is to provide an electronic device provided with such the display device.

In the invention, the gamma value in gamma correction is suppressed to values as low as 2.0 or below (preferably, 1.6 to 1.8). Additionally, the invention is to provide a display device for $2^n-\alpha$ a levels of gray scale display ($n<k\leq 2n$, $\alpha$ is a natural number) with the use of a display device allowing $2^k$ levels of gray scale display ($n<k\leq 2n$) and a method for driving the same.

Furthermore, a display device of the invention is characterized in that it has display performance of real luminance scale in a bit number greater than the bit number of perceived luminance scale to be outputted in original intention, and the gamma value is suppressed as much as possible to prevent burdens such as costs and power consumption caused by unnecessarily enhancing the display performance of real luminance and to prevent omissions from being generated in gray scales.

In the invention, a display device allowing y-bit display (y is a natural number) is characterized by comprising: a gamma correction circuit for correcting a video signal at a gamma value of 2.0 or below; and a pixel part for x-bit display (x<y, x is a natural number) by the video signal.

In the invention, a display device allowing $2^k$ gray scale display ($n<k\leq 2n$) is characterized by comprising: a gamma correction circuit for correcting a video signal at a gamma value of 2.0 or below; and a pixel part for $2^n-\alpha$ gray scale display ($0<\alpha<2^n$, $\alpha$ is a natural number) by the video signal.

In the invention, a method for driving a display device allowing $2^k$ gray scale display ($n<k\leq 2n$) is characterized by comprising: correcting a video signal at a gamma value of 2.0 or below in a gamma correction circuit; and performing $2^n-\alpha$ gray scale display ($0<\alpha<2^n$, $\alpha$ is a natural number) with the video signal in a pixel part.

In the invention, a method for driving a display device having a gamma correction circuit for correcting a video signal at a gamma value of 2.0 or below and a pixel part including a plurality of pixels disposed with a light emitting element, the method for driving the display device is characterized by comprising: inputting the video signal to the plurality of pixels in write periods Ta1, Ta2, ... and Tan; and selecting to light or not to light the pixel by the video signal in display periods Tr1, Tr2, ... and Trn, wherein one frame period has the n write periods Ta1, Ta2, ... and Tan, and (m−1) erase times Te1, Te2, ... and Te(m−1) (m is an arbitrary number from 2 to n), among the n write periods Ta1, Ta2, ... and Tan, the write periods Ta1, Ta2, ... and Tam are overlapped with the erase times Te1, Te2, ... and Te(m−1) each other, respectively, a period of time to start each of the (m−1) erase times Te1, Te2, ... and Te(m−1) after having started each of the write periods Ta1, Ta2, ... and Tan is the display periods Tr1, Tr2, ... and Tr(m−1), a ratio of lengths of the display periods Tr1, Tr2, ... and Trn is expressed by $2^0:2^1:\ldots 2^{(n-1)}$, and a period of time to start each of the n write periods Ta1, Ta2, ... and Tan after having started each of the (m−1) erase times Te1, Te2, ... and Te(m−1) is non-display periods Td1, Td2, ... and Tdn.

BRIEF DESCRIPTION OF THE DRAWINGS

FIGS. 15A and 15B are diagrams of graphs depicting the relationship between the gray scale and the perceived luminance.

DESCRIPTION OF THE PREFERRED EMBODIMENT

Figure 1:
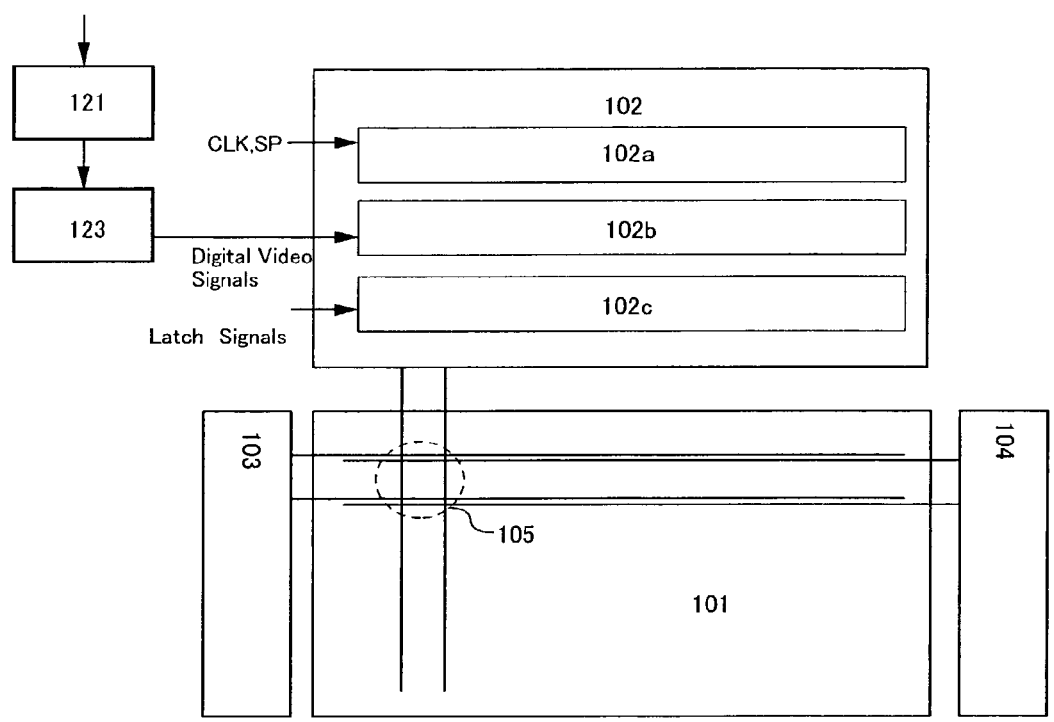
FIG. 1 is a diagram depicting a schematic diagram of the display device of the invention.

The embodiments of the invention will be described by FIGS. 1, 4 and 5.

First, the configuration of the display device of the invention will be described by FIG. 1. FIG. 1 depicts an example of a block diagram of a light emitting device. The light emitting device shown in FIG. 1 has a pixel part 101 configured of TFTs formed on a substrate, and a source signal line drive circuit 102, a gate signal line drive circuit 103 and a counter power source line drive circuit 104 disposed around the pixel part 101. In addition, the light emitting device illustrated in the embodiment has one source signal line drive circuit, one gate signal line drive circuit, and one counter power source line drive circuit, but the invention is not limited to this. The number of the drive circuits can be set arbitrarily.

Furthermore, the light emitting device of the invention has a gamma correction circuit 123 connected to the source signal line drive circuit 102 and an A/D converter circuit 121.

The A/D converter circuit 121 converts analogue video signals into digital video signals. The converted digital video signals are fed to the gamma correction circuit 123, and they are gamma corrected at a predetermined gamma value (2.0 or below, preferably 1.6 to 1.8) in the gamma correction circuit 123. The corrected digital video signals are fed to a latch (A) 102b. Moreover, only the A/D converter circuit 121 and the gamma correction circuit 123 are provided in the invention, but the invention is not limited to this. An arithmetic processing circuit and an image signal processing circuit may be provided. Besides, when the video signals to be fed are already digital video signals, the A/D converter circuit 121 may not be provided.

Additionally, in the invention, the source signal line drive circuit 102, the gate signal line drive circuit 103, and the counter power source line drive circuit 104 may be disposed on the substrate where the pixel part 101 is arranged, or they may be disposed on an IC chip and connected to the pixel part 101 through an FPC or TAB. The gamma correction circuit 123 and the A/D converter circuit 121 may also be disposed on the substrate, or they may be disposed on an IC chip and connected to the pixel part 101 through an FPC or TAB.

The source signal line drive circuit 102 typically has a shift register 102a, a latch (A) 102b, and a latch (B) 102c. In the source signal line drive circuit 102, the clock signal (CLK) and the start pulse (SP) are inputted to the shift register 102a. The shift register sequentially creates timing signals based on the clock signal (CLK) and the start pulse (SP), and it sequentially inputs the timing signals to a circuit at the subsequent stage through a buffer (not shown).

The timing signals fed from the shift register 102a are buffer amplified by the buffer. The wiring that the timing signals are outputted is connected to many circuits or elements, and thus it has a large load capacity (parasitic capacitance). The buffer is disposed for preventing slow rise time or fall time of the timing signal due to the large load capacity. Furthermore, the buffer is not necessarily disposed.

The buffer amplified timing signals by the buffer are inputted to the latch (A) 102b. The latch (A) 102b has a plurality of stages of latches for processing the digital video signals. When the timing signals are inputted, the digital video signals inputted from the gamma correction circuit 123 are sequentially written and held in the latch (A) 102b.

Additionally, in writing the digital video signals in the latch (A) 102b, the digital video signals may be sequentially written in the plurality of stages of latches held by the latch (A) 102b. However, the invention is not limited to the configuration, which may perform so-called split drive that the plurality of stages of latches held by the latch (A) 102b is split into some groups and the digital video signals are written in each group simultaneously. Additionally, the number of groups at this time is called a split number. For example, when the latches are grouped at every four stages, it is called split driving by four splits.

Time to complete the digital video signals being written in the latches in the entire stages of the latch (A) 102b is called a line period. Actually, the line period sometimes includes the time that horizontal retrace period is added to the line period.

Then, when one line period is finished, the latch signal is inputted to the latch (B) 102c. At this moment, all the digital video signals written and held in the latch (A) 102b are sent to the latch (B) 102c, and they are written and held in the latches in the entire stages of the latch (B) 102c.

In the latch (A) 102b having sent the digital video signals to the latch (B) 102c, digital video signals are sequentially written based on the timing signal from the shift register 102a.

Figure 4:
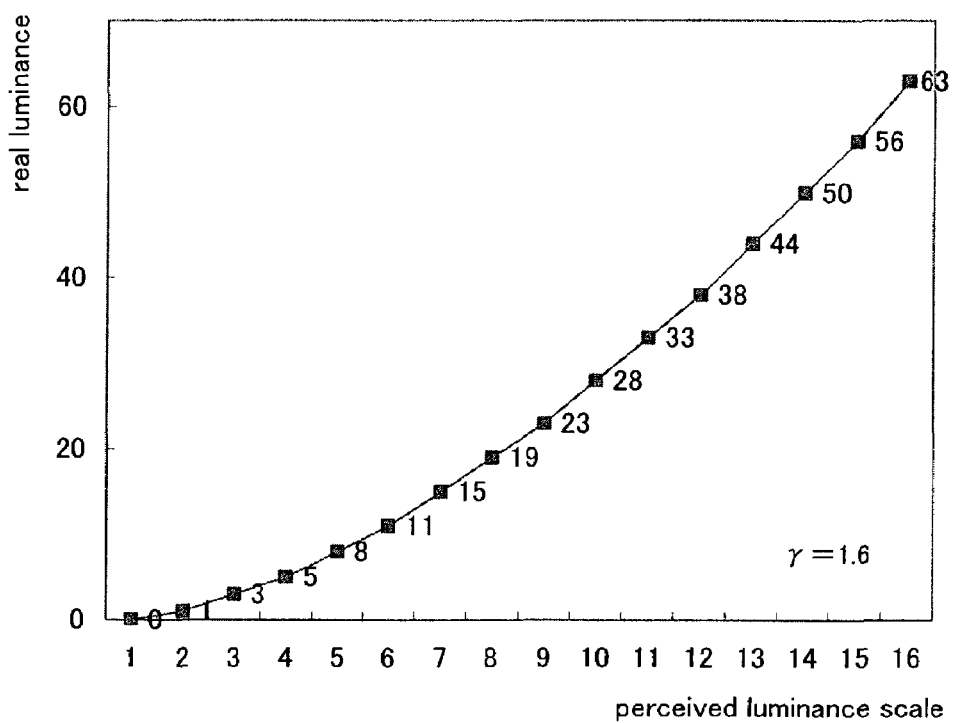
FIG. 4 is a diagram depicting the video signal inputted to the pixel part of the invention.

Here, FIG. 4 depicts the video signals used for displaying an image of 16 levels of gray scale (four bits) with the light emitting device of the invention. In the graph shown in FIG. 4, the horizontal axis is the perceived luminance scale (X) and the vertical axis is the real luminance (Y). The perceived luminance scale (X) in the horizontal axis is video signals converted into digital signals from analogue signals by the A/D converter circuit 121 in FIG. 1. The real luminance (Y) in the vertical axis is video signals gamma corrected by the gamma correction circuit 123, expressing the video signals actually fed in the pixel 105. More specifically, the perceived luminance scale (X) in the horizontal axis expresses the video signals having originally intended to be fed in the pixel 105, and the real luminance (Y) in the vertical axis expresses the video signals to be gamma corrected and fed in the pixel 105.

In the invention, 16 levels of gray scale (equivalent to four bits), the desired gray scale number, are expressed by the light emitting device having the display performance of 64 levels of gray scale (equivalent to six bits) in the real luminance scale. More specifically, images are displayed by the light emitting device having the display performance of real luminance in a greater bit number (equivalent to six bits) than the bit number to be outputted in original intention (equivalent to four bits). Consequently, as shown in FIG. 4, the sufficient real luminance area is provided for each gray scale, and thus omissions in gray scales can be prevented.

In addition, in the embodiment, 1.6 is used as the gamma value in gamma correction. The gamma value is suppressed low, and thus images can be displayed without unnecessarily enhancing the real luminance. That is, increases in burdens such as costs and power consumption of the light emitting device can be avoided, and easy fabrication processes and yields can be secured.

Figure 5:
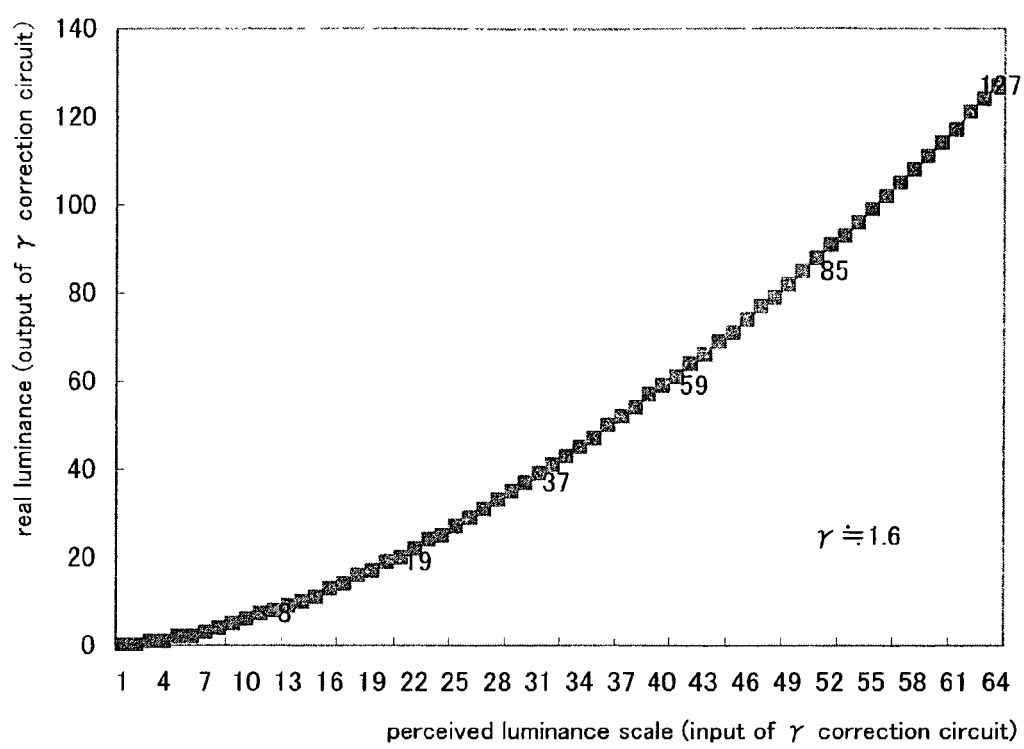
FIG. 5 is a diagram depicting the video signal inputted to the pixel part of the invention.

Next, FIG. 5 depicts a graph of the video signals used for displaying an image of 64 levels of gray scale (equivalent to six bits) with the light emitting device of the invention. In the graph shown in FIG. 5, the horizontal axis is the perceived luminance scale (X) and the vertical axis is the real luminance (Y).

Furthermore, as similar to FIG. 4, the perceived luminance scale (X) in the horizontal axis expresses the video signals having originally intended to be fed in the pixel 105, and the real luminance (Y) in the vertical axis expresses the video signals to be gamma corrected and fed in the pixel 105.

In the embodiment, 64 levels of gray scale (equivalent to six bits), desired gray scales, are expressed by the light emitting device having the display performance of 128 levels of gray scale (equivalent to seven bits). More specifically, in the invention, images are displayed by the light emitting device having the display performance of real luminance in a greater bit number (equivalent to seven bits) than the bit number to be outputted in original intention (equivalent to six bits). Consequently, as shown in FIG. 5, the sufficient area exists for each gray scale, and thus omissions in the gray scales can be suppressed to only three parts.

In addition, the invention uses 1.6 as the gamma value in gamma correction. The gamma value is suppressed low, and thus images can be displayed without unnecessarily enhancing the real luminance. More specifically, increases in burdens such as costs and power consumption of the light emitting device can be avoided, and easy fabrication processes and yields can be secured.

Embodiment 1

In the present embodiment, the configuration of a pixel portion 101*as* show in FIG. 1 will be described with reference to FIGS. 2 and 3.

Figure 2:
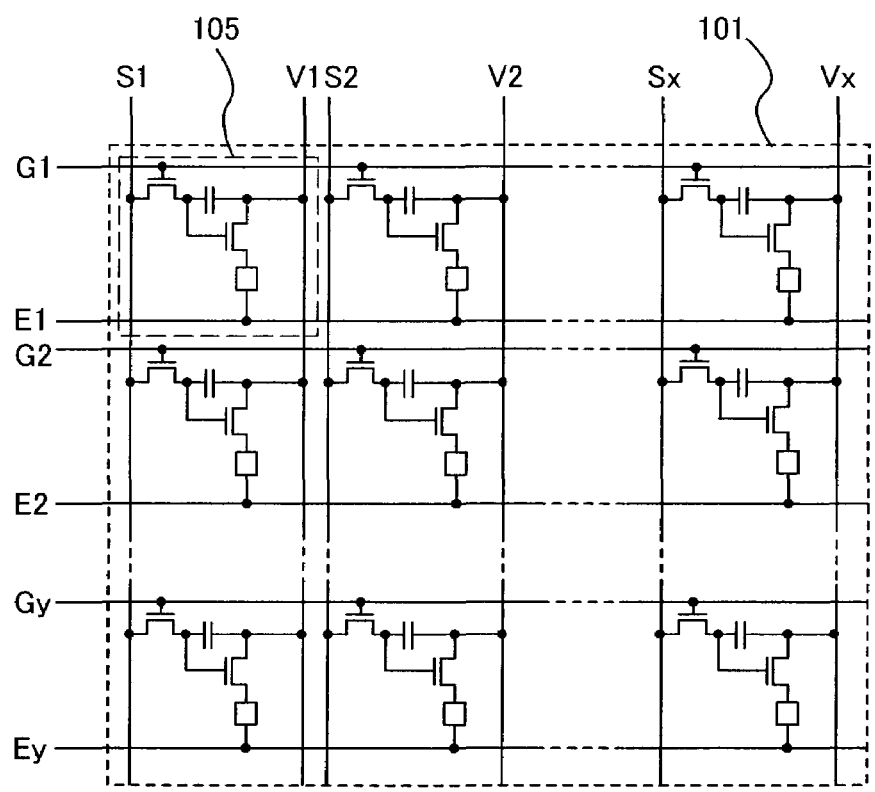
FIG. 2 is a diagram depicting a circuit diagram of a pixel part of the display device of the invention.

FIG. 2 shows an enlarged view of an example of the pixel portion 101. In the pixel portion 101, source signal lines (S1 to Sx), power supply lines (V1 to Vx), gate signal lines (G1 to Gy), and opposing power source lines (E1 to Ey) are provided in matrix.

In the present embodiment, a pixel 105 refers to a region surrounded by one of the source signal lines (S1 to Sx), one of the power supply lines (V1 to Vx), one of the gate signal lines (G1 to Gy), and one of the opposing power source lines (E1 to Ey). In the pixel portion 101, a plurality of the pixels 105 is arranged in matrix.

Figure 3:
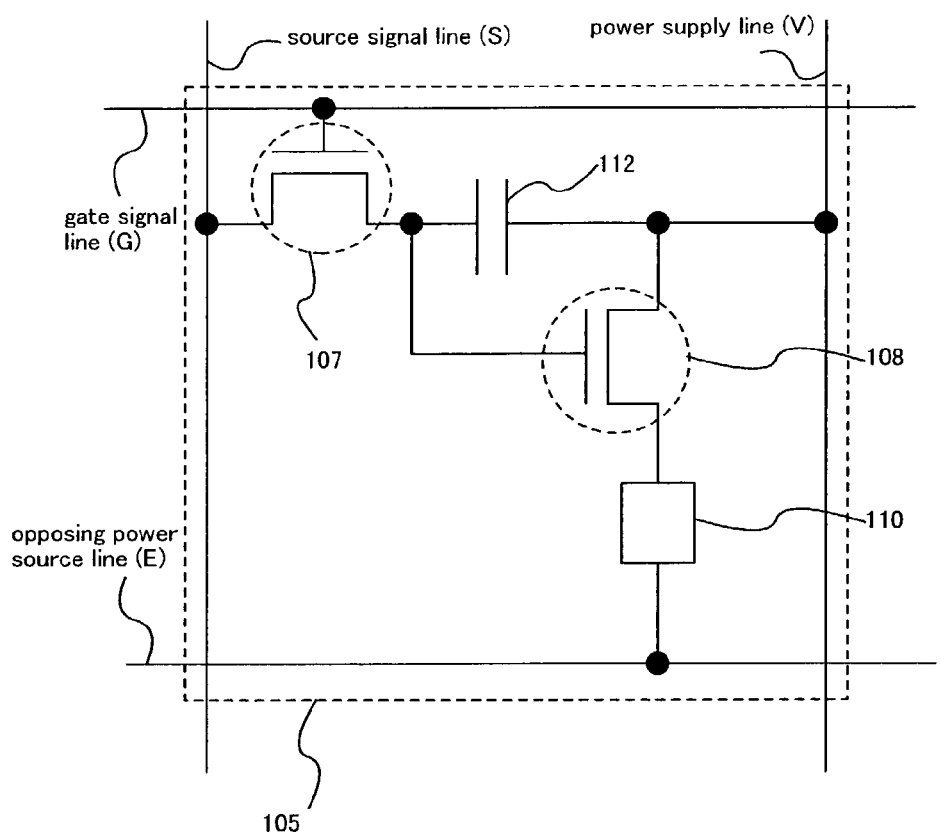
FIG. 3 is a diagram depicting a circuit diagram of a pixel of the display device of the invention.

An enlarged view of the pixel 105 is shown in FIG. 3. In FIG. 3, reference numeral 107 denotes a switching TFT, reference numeral 108 denotes a driving TFT, reference numeral 110 denotes a light emitting element, and reference numeral 112 denotes a capacitor.

A gate electrode of the switching TFT 107 is connected to the gate signal line G (one of G1 to Gy). One of a source region and a drain region of the switching TFT 107 is connected to the source signal line S (one of S1 to Sx), while the other thereof is connected to a gate electrode of a driving TFT 108 as well as to a capacitor 112 of each pixels.

The capacitor 112 is provided for holding a gate voltage of the driving TFT 108 when the switching TFT 107 is in the non-selected condition (off condition). Although the capacitor 112 is provided in the present embodiment, the present invention is not limited to such a structure. The capacitor 112 may be omitted.

Further, the source region of the driving TFT 108 is connected to the power supply line V (one of V1 to Vx), while the drain region is connected to the light emitting element 110. The power supply line V is connected to a power source (not shown) provided in the outside of a substrate which includes the pixel portion 101, and a constant power source potential is continuously applied to the power supply line V.

Further, the power supply line V is connected to the capacitor 112.

The light emitting element 110 is composed of an anode, a cathode, and a light emitting layer comprising an organic material provided between the anode and the cathode. In the case where the anode is connected to the drain region of the driving TFT 108, the anode functions as the pixel electrode and the cathode functions as a opposing electrode. On the other hand, in the case where the cathode is connected to the drain region of the driving TFT 108, the cathode functions as the pixel electrode and the anode functions as the opposing electrode.

Note that the light emitting element has a structure that a light emitting layer is interposed between a pair of the electrodes (anode and cathode). The light emitting layer can be manufactured by known light emitting materials. Further, the light emitting layer includes two structures of a single-layer structure and a lamination structure, and both structure may be used. Note that luminescence in the light emitting layer includes a light emission when returning to a base state from a singlet excited state (fluorescence), and a light emission when returning to a base state to a triplet excited state (phosphorescence), and either type of light emission can be used.

The opposing electrode of the light emitting element 110 is connected to the opposing power source lines E (one of E1 to Ey). The potential of the opposing power source lines E is referred to as an opposing potential.

Both an n-channel TFT and a p-channel TFT can be used as the switching TFT 107 and the driving TFT 108. Incidentally, in the case where the anode of the light emitting element 110 functions as a pixel electrode and the cathode of the light emitting element 110 functions as a opposing electrode, it is preferable that the driving TFT 108 is the p-channel TFT. On the other hand, in the case where the anode of the light emitting element 110 functions as a opposing electrode and the cathode of the light emitting element 110 functions as a pixel electrode, it is preferable that the driving TFT 108 is the n-channel TFT.

Also, the switching TFT 107 and the driving TFT 108 may have a multi-gate structure such as a double gate structure and a triple gate structure in addition to the single gate structure.

Note that the present embodiment can be freely combined with Embodiment Mode.

Embodiment 2

In this embodiment, a configuration of a pixel, which is different from Embodiment 1, will be described with reference to FIG. 14.

Figure 14:
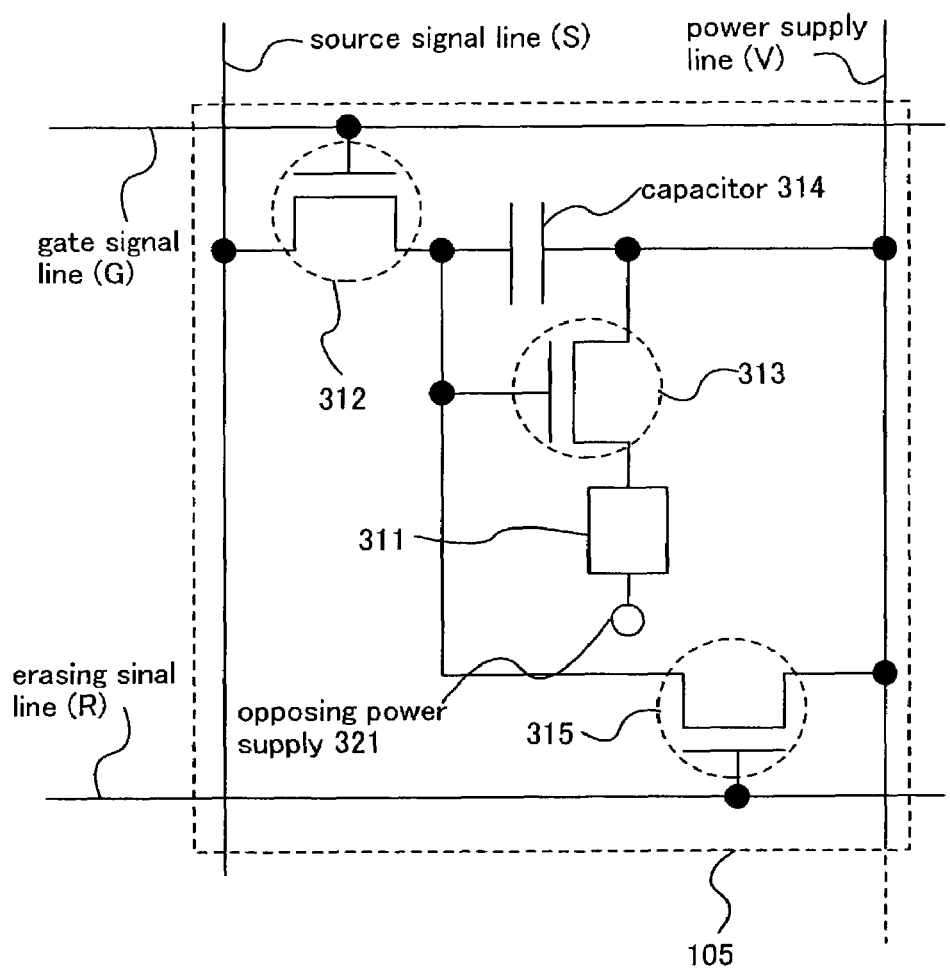
FIG. 14 is a diagram depicting a circuit diagram of a pixel of the display device of the invention.

A pixel 105 shown in FIG. 14 includes a light emitting element 311, a switching transistor 312, a driving transistor 313, an erasing transistor 315, and a capacitor 314. The pixel 105 is surrounded by source signal lines S (one of S1 to Sx), power supply lines V (one of V1 to Vx), gate signal lines G (one of G1 to Gy), and erasing signal lines R (one of R1 to Ry).

A gate electrode of the switching transistor 312 is connected to the gate signal line G. One of a source region and a drain region of the switching transistor 312 is connected to the source signal line S, while the other thereof is connected to a gate electrode of a driving transistor 313. The switching transistor 312 functions as a switching element when a signal is input in the pixel 105.

The capacitor 314 is provided for holding a gate voltage of the driving transistor 313 when the switching transistor 312 is in the non-selected condition (off condition). Although the capacitor 314 is provided in the present embodiment, the present invention is not limited to such a structure. The capacitor 314 may be omitted.

The source region of the driving transistor 313 is connected to the power supply line V, while the drain region of the driving transistor 313 is connected to the light emitting element 311. Further, the power supply line (Vi) is connected to the capacitor 314. The driving transistor 313 is a transistor which functions as an element (current controlling element) in order to control a current supplied in the light emitting element 311

The light emitting element 311 is composed of an anode, a cathode, and a light emitting layer provided between the anode and the cathode. In the case where the anode is connected to the drain region of the driving transistor 313, the anode functions as the pixel electrode and the cathode functions as a opposing electrode. On the other hand, in the case where the cathode is connected to the drain region of the driving transistor 313, the cathode functions as the pixel electrode and the anode functions as the opposing electrode.

A gate electrode of the erasing transistor 315 is connected to an erasing signal line R. One of a source region and a drain region of the erasing transistor 315 is connected to the power supply line (Vi), while the other thereof is connected to a gate electrode of the driving transistor 313. The erasing transistor 315 is a transistor which functions as a element in order to eliminate (reset) signals written in the pixel 105.

In the pixel potion shown in the FIG. 1, a plurality of the pixels 105 shown in FIG. 14 are arranged in matrix. Further, in the pixel portion 101, the source signal lines (S1 to Sx), the gate signal lines (G1 to Gy), the power supply lines (V1 to Vx), and the erasing signal lines (R1 to Ry) are arranged in matrix.

Note that present embodiment can be freely combined with Embodiment.

Embodiment 3

Figure 6:
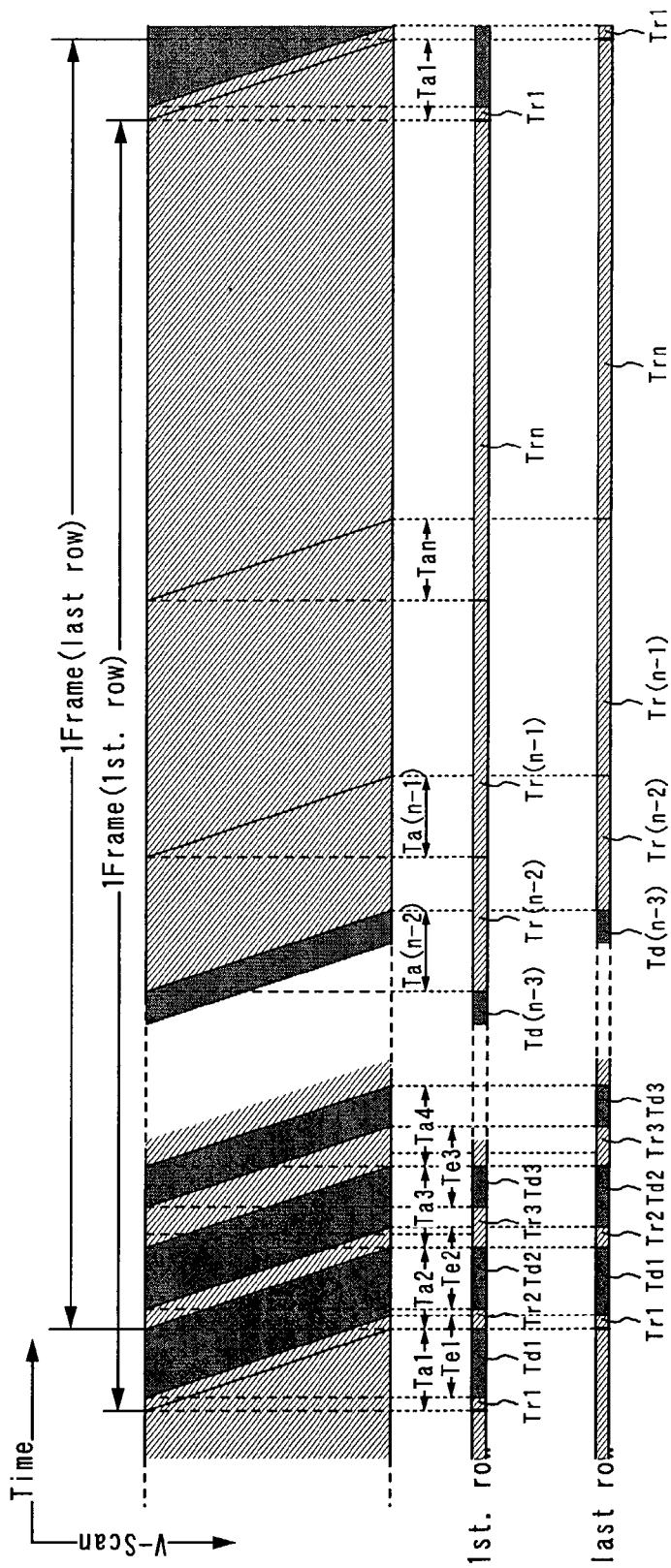
FIG. 6 is a diagram illustrating a method for driving the display device of the invention.

In this Embodiment, a method of driving the light emitting device shown in FIGS. 1 to 3 will be described with reference to FIG. 6.

First, an opposing electric potential supplied to an opposing power source line E1 is kept at a potential (an ON electric opposing potential) by the opposing electrode power source line driver circuit 104. The ON opposing electric potential refers to an electric potential different from the power supply electric potential to a degree that causes the light emitting element to emit light when the power supply electric potential is given to the pixel electrode.

Then the gate signal line G1 is selected upon input of a gate signal inputted to the gate signal line G1 from the gate signal line driver circuit 103. As a result, the switching TFT 107 is turned ON in every pixel that is connected to the gate signal line G1 (pixels on the first line).

Then, the first bit of a digital video signal input to the source signal lines S1 to Sx from the source signal line driver circuit 102 is input to the gate electrodes of the driving TFTs 108 through the switching TFTs 107. Note that the input of the digital video signal to the gate electrodes of the driving TFTs 108 through the switching TFTs 107 indicates that the digital video signal is inputted to the pixels in this specification.

The digital video signal has information of "0" or "1". The digital video signal of "0" and "1" are signals where one has a Hi level (H level) voltage, while the other has a Lo level (L level) voltage.

In this Embodiment, in the case where the digital video signal has information of "0", the driving TFT 108 is turned OFF. Accordingly, the power source electric potential is not applied to the pixel electrode of the light emitting element 110. As a result, the light emitting element 110 included in the pixel, to which the digital video signal having information of "0" is input, does not emit light.

On the contrary, in the case where the digital video signal has information of "1", the driving TFT 108 is turned ON. Accordingly, the power source electric potential is applied to the pixel electrode of the light emitting element 110. As a result, the light emitting element 110 included in the pixel, to which the digital video signal having information of "1" is input, emits light.

In this Embodiment, in the case where the digital video signal has information of "0", the driving TFT 108 is turned OFF, and in the case where the digital video signal has information of "1", the driving TFT 108 is turned ON. However, the present invention is not limited to such a structure. Alternatively, the driving TFT 108 may be turned ON with the digital video signal having information of "0", and the driving TFT 108 may be turned OFF with the digital video signal having information of "1".

In this way, simultaneously with the input of the digital video signal of the first bit of pixels, the elements 110 are brought into a light emitting state or a non-light emitting state so that the pixels on the first line perform display. A period during which pixels perform display is referred to as a display period Tr. In particular, a display period that starts with the input of the digital video signal of the first bit to a pixel is designated as Tr1. The timing at which the display period of each line starts has a time difference, respectively.

When the gate signal line G1 is selected no longer, the opposing power source line E2 is given and kept at the ON opposing electric potential by the opposing power source line driver circuit 104 while the opposing power source line E1 is kept at the ON opposing electric potential. The gate signal line G2 is selected upon input of the gate signal, so that the switching TFT 107 is turned ON in every pixel that is connected to the gate signal line G2 and the 1 bit digital video signal is inputted from the source signal lines S1 to Sx into the pixels on the second line.

Thus, all of the opposing power source lines E1 to Ex are kept at the opposing electric potential sequentially. Also, the gate signal lines G1 to Gy are all sequentially selected, so that the 1 bit digital video signal is inputted to all of the pixels. The period required to input the 1 bit digital video signal into the entire pixels is called a writing period Ta1.

On the other hand, the opposing electric potential given to the opposing power source line E1 is kept at the same level of electric potential as the power supply electric potential (OFF opposing electric potential) by the opposing power source line driver circuit 104. This is carried out as the 1 bit digital video signal is inputted to the pixels before the input of the digital video signal to all of the pixels is completed, in other words, before the writing period Ta1 is ended. This brings every light emitting element whose opposing electrode is connected to the opposing power source line E1 to non-light emission state. Accordingly, every pixel having an light emitting element whose opposing electrode is connected to the opposing power source line E1 (pixels on the first line) stops displaying.

The period during which the pixels stops displaying is called a non-display period Td. In the pixels on the first line, the display period Tr1 is ended to start a non-display period Td1 as soon as the opposing power source line E1 is given the OFF opposing electric potential to be kept at that potential. Similar to the case of the display periods, a gap of time is set between the starting points of the non-display periods for the respective lines.

While the opposing power source line E1 is kept at the OFF opposing electric potential, the opposing power source line E2 is then given the OFF opposing electric potential to be kept at that potential. As a result, every pixel having an light emitting element whose opposing electrode is connected to the opposing power source line E2 (pixels on the second line) is brought into non-display state where the pixel stops displaying.

In this way, the opposing power source lines are sequentially given the OFF opposing electric potential. The period required to complete giving all the opposing power source lines E1 to Ey OFF opposing electric potential to keep them at the potential and bringing all pixels that have been displaying upon input of the 1 bit digital signal to non-display state is called an erasing period Te1.

On the other hand, the opposing power source line E1 is again given and kept at the ON opposing electric potential as the pixels are brought into non-display state before all of the opposing power source lines E1 to Ey complete receiving the OFF opposing electric potential and are kept at the potential, in other words, before the erasing period Te1 is ended. Then the gate signal line G1 is selected upon input of the gate signal and the 2 bit digital video signal is inputted to the pixels on the first line. As a result, the pixels on the first line begin to display again, thereby ending the non-display period Td1 and starting a display period Tr2.

In the same manner, the opposing power source lines are sequentially given the ON opposing electric potential. Thus the gate signal lines are all sequentially selected, so that the 2 bit digital video signal is inputted to all of the pixels. The period required to complete inputting the 2 bit digital video signal to all of the pixels is called a writing period Ta2.

On the other hand, the opposing power source line E1 is given and kept at the OFF opposing electric potential as the 2 bit digital video signal is inputted to the pixels before the input of the 2 bit digital video signal to all of the pixels is completed, in other words, before the writing period Ta2 is ended. This brings all the light emitting elements of the pixels on the first line to non-light emission state and the pixels on the first line stop displaying. The display period Tr2 is thus ended to start a non-display period Td2 in the pixels on the first line.

Then all opposing power source lines are kept at the OFF opposing electric potential sequentially. The period required to complete giving all of the opposing power source lines E1 to Ey the OFF opposing electric potential to keep them at the potential and bringing all the pixels that have been displaying upon input of the 2 bit digital video signal to non-display state is called an erasing period Te2.

The operation described above is repeated until the m bit digital video signal is inputted to the pixels, and the display periods Tr and the non-display periods Td start and end again and again during the repetitive operation. The display period Tr1 of the pixels on the respective lines corresponds to a period which starts as the opposing electrodes of the pixels on the respective lines receive the ON opposing electric potential during the writing period Ta1 so that the digital video signal is written into the pixels on the respective lines and which ends as the opposing electrodes of the pixels on the respective lines receive the OFF opposing electric potential during the erasing period Te1. The non-display period Td1 of the pixels on the respective lines corresponds to a period which starts as the opposing electrodes of the pixels on the respective lines receive the OFF opposing electric potential during the erasing period Te1 and which ends as the opposing electrodes of the pixels on the respective lines receive the ON opposing electric potential during the next writing period (the writing period Ta2, in this case) so that the digital video signal is written into the pixels on the respective lines. The length of the display periods Tr2, Tr3, . . . and Tr(m−1) and the non-display periods Td2, Td3, . . . and Td(m−1) are set in a manner similar to the case of the display period Tr1 and the non-display period Td1.

An example of a case in which m=n−2 is shown by FIG. 4 in order to make the explanation easy to be understood, but the present invention is of course not limited to this. It is possible to arbitrarily select m from 1 to n with the present invention.

Next, the opposing power source line E1 is given and kept at the ON opposing electric potential and the m[n−2 (hereinafter brackets indicate that it applies to the case where m=n−2)] bit digital video signal is inputted to the pixels on the first line. Thus the pixels on the first line enter a display period Trm[n−2] to begin displaying.

Similarly, the opposing power source lines are sequentially given the ON opposing electric potential until all of them are kept at the potential. Thus the m[n−2] bit digital video signal is inputted to the pixels on all the lines, and the pixels on all the lines enter the display period Trm[n−2] to begin displaying.

The m[n−2] bit digital video signal is held in the pixels until the next bit digital video signal is inputted.

The (m+1)[n−1] bit digital video signal is next inputted to the pixels on the first line while all of the opposing power source lines are kept at the ON opposing electric potential. Then rewriting takes place and the m[n−2] bit digital video signal held in the pixels are replaced by the (m+1)[n−1] bit digital video signal. The pixels on the first line thus enter a display period Tr(m+1)[n−1] to begin displaying.

Similarly, the opposing power source lines are sequentially given the ON opposing electric potential to be kept at the potential. While all of the opposing power source lines are kept at the ON opposing electric potential, the (m+1)[n−1] bit digital video signal is inputted to the pixels on all the lines. The pixels on all the lines thus enter the display period Tr(m+1)[n−1] to begin displaying.

The (m+1)[n−1] bit digital video signal is held in the pixels until the next bit digital video signal is inputted.

The operation described above is repeated until the n bit digital video signal is inputted to the pixels. The display period Trm[n−2], . . . , Trn of the pixels on the respective lines corresponds to a period which starts as the opposing electrodes of the pixels on the respective lines receive the ON opposing electric potential during the writing period Tam[n−2], ..., Tan so that the digital video signal is written into the pixels on the respective lines and which ends as the opposing electrodes of the pixels on the respective lines receive the ON opposing electric potential during the next writing period so that the digital video signal is written into the pixels on the respective lines.

One image can be displayed after all of the display periods Tr1 to Trn are completed. A period required to display one image is called one frame period (F) in the present invention. According to the driving method of the present invention, the length of the frame period (F) varies between pixels on one line and pixels on another line. The frame period for the pixels on the y-th line starts with a delay substantially corresponding the length of the writing period Ta1 from the start of the frame period for the pixels on the first line.

After one frame period is ended, the opposing power source lines E1 to Ey are again kept at the ON opposing electric potential, and the gate signal line G1 is selected upon input of the gate signal. Then the 1 bit digital video signal is inputted to the pixels, so that the pixels on the first line again enter the display period Tr1. The operation described above is thus repeated again.

It is preferable to form 60 or more frame periods every second with a light emitting device. If the number of images displayed in one second becomes less than 60, image flicker starts to become visually conspicuous.

Further, it is necessary for the sum of the lengths of all of the writing periods to be shorter than one frame period in the present invention. In addition, the length of the display periods must be set so that $Tr1:Tr2:Tr3:...:Tr(n-1):Trn=2^0:2^1:2^2:...:2^{(n-2)}:2^{(n-1)}$. The desired gray-scale display can then be performed from among $2^n$ gray scales by combining the display periods.

The length of the gray scale displayed by a pixel during one frame period is decided by finding the total sum of the lengths of the display periods during which the light emitting element of the pixel emits light during the one frame period. For example, when n=8, if the luminance for a case in which the pixels emit light during all of the display periods is taken as 100%, then a luminance of 1% can be expressed for a case in which the pixels emit light during Tr1 and Tr2. When the pixels emit light in Tr3, Tr5, and Tr8, a luminance of 60% can be expressed.

It is vital that the writing period Tam, in which the number m bit of the digital video signal is written to the pixels, be shorter than the length of the display period Trm. It is necessary, therefore, that the value of the number of bits m be a value, from among 1 to n, at which the writing period Tam is shorter than the length of the display period Trm.

Further, the display periods Tr1 to Trn may appear in any order. For example, it is possible for the display periods to appear such that Tr3, Tr5, Tr2, ..., follow after Tr1 within one frame period. However, it is preferable that the display periods Tr1 to Trn are in an order at which they do not mutually overlap. Further, it is preferable that the erasing periods Te1 to Ten also are in an order such that they do not mutually overlap.

Non-display periods during which display is not performed can be provided in the present invention. If a completely white image is displayed in the light emitting display device when using a conventional analog driving method, then the light emitting elements always emit light and this becomes a cause of quickening light emitting layers (light emitting element) degradation. Non-display periods can be formed with the present invention, and therefore degradation of the light emitting layers can be suppressed to a certain extent.

Note that portions of the display periods and the writing periods overlap in the present invention. In other words, it is possible to have pixel display even during the writing periods. Therefore, the ratio of the total sum of the lengths of the display periods in one frame period (duty ratio) is not determined only by the lengths of the writing periods.

According to the structure of the present invention, only two transistors consisting of a switching TFT and a driving TFT have to be provided in each pixel as in prior art. Therefore the aperture ratio of the pixel is not reduced.

Note that a structure is shown in this embodiment mode in which a capacitor is formed in order to store the voltage applied to the gate electrode of the driving TFT, but it is also possible to omit the capacitor. If the driving TFT has an LDD region formed so as to overlap with the gate electrode through a gate insulating film, a parasitic capacitance, referred to generally as a gate capacitance, is formed in the overlapping region. This gate capacitance can be actively used as a capacitor in order to store the voltage applied to the gate electrode of the driving TFT.

The capacitance value of the gate capacitance changes in accordance with the surface area over which the gate electrode and the LDD region overlap, and is determined by the length of the LDD region contained in the overlapping region.

In the present invention, the gamma value in gamma correction is suppressed to values as low as 2.0 or below (preferably, 1.6 to 1.8). Furthermore, the invention displays $2^n-\alpha$ levels of gray scale ($0<\alpha<2^n$, $\alpha$ is a natural number) with the display device allowing $2^k$ gray scale display ($n<k\leq 2^n$). That is, a display device of the invention has display performance of real luminance scale in a bit number greater than the bit number to be outputted in original intention.

As result, present invention can provide a display device and method of driving the display device, which prevents burdens such as costs and power consumption caused by unnecessarily enhancing the display performance of real luminance and prevents omissions from being generated in gray scales.

Note that present invention can be freely combined with Embodiment Mode, and Embodiment 1 and 2.

Embodiment 4

Figure 7:
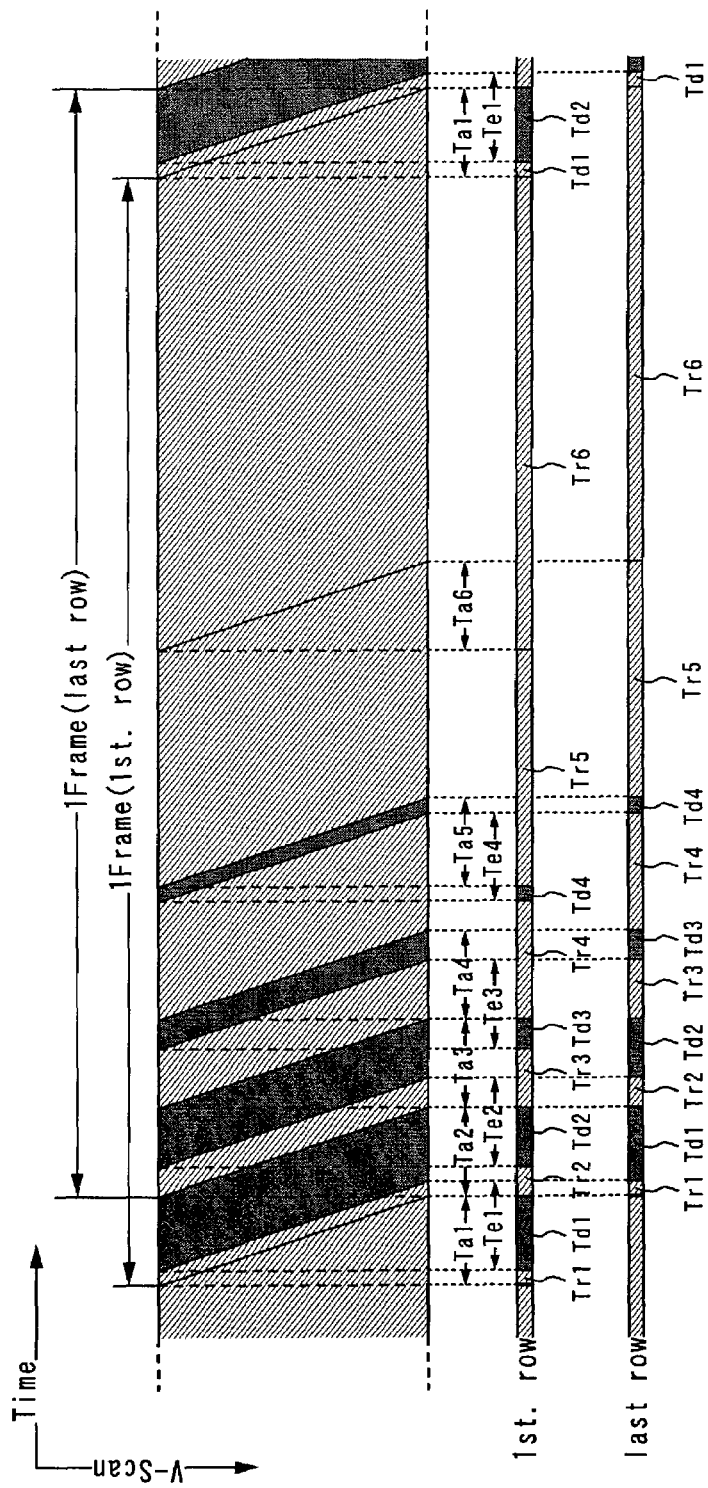
FIG. 7 is a diagram illustrating the method for driving the display device of the invention.

A case of performing $2^6$ gray scale display by a 6 bit digital video signal in an light emitting device of the present invention is explained in Embodiment 4 using FIG. 7. Note that the light emitting device of Embodiment 4 has the structure shown in FIGS. 1 to 3.

First, an opposing electric potential supplied to an opposing power source line E1 is kept at a potential (an ON opposing electric potential) by the opposing electrode power source line driver circuit 104. The ON opposing electric potential refers to an electric potential different from the power supply electric potential to a degree that causes the light emitting element to emit light when the power supply electric potential is given to the pixel electrode.

The gate signal line G1 then is selected in accordance with a write in gate signal input to the write in gate signal line G1 from the gate signal line driver circuit 103. The switching TFTs 107 of all pixels (the first line of pixels) connected to the write in gate signal line G1 are then placed in an ON state.

Then, the first bit of a digital video signal is input to the source signal lines S1 to Sx from the source signal line driver circuit 102. The digital video signal is input to the gate electrode of the driving TFTs 108 through the switching TFTs 107.

When the digital video signal has "0" information, the driving TFTs 108 are placed in an OFF state in Embodiment 4. The power source electric potential is therefore not imparted to the pixel electrode of the light emitting elements 110. As a result, the light emitting elements 110 of pixels into which the digital video signals having "0" information are input do not emit light.

Conversely, the driving TFTs 108 are placed in an ON state when a digital video signal has "1" information. The power source electric potential is therefore imparted to the pixel electrodes of the light emitting elements 110. As a result, the light emitting elements 110 of pixels into which the digital video signals having "1" information are input emit light.

The light emitting elements 110 perform light emission or do not preform light emission at the same time as the digital video signal is input to the first line of pixels, becoming the display period Tr1. The timing at which the display periods of each line begin have each time differences.

When the gate signal line G1 is selected no longer, the opposing power source line E2 is given and kept at the ON opposing electric potential by the opposing power source line driver circuit 104 while the opposing power source line E1 is kept at the ON opposing electric potential. The gate signal line G2 is selected upon input of the gate signal, so that the switching TFT 107 is turned ON in every pixel that is connected to the gate signal line G2 and the 1 bit digital video signal is inputted from the source signal lines S1 to Sx into the pixels on the second line.

Thus, all of the opposing power source lines E1 to Ex are sequentially kept at the opposing electric potential. Also, the gate signal lines G1 to Gy are all sequentially selected, so that the 1 bit digital video signal is inputted to all of the pixels. The period required to input the 1 bit digital video signal into the entire pixels is called a writing is period Ta1.

On the other hand, the opposing electric potential given to the opposing power source line E1 is kept at the same level of electric potential as the power supply electric potential (OFF opposing electric potential) by the opposing power source line driver circuit 104. This is carried out as the 1 bit digital video signal is inputted to the pixels before the input of the digital video signal to all of the pixels is completed, in other words, before the writing period Ta1 is ended. This brings every light emitting element whose opposing electrode is connected to the opposing power source line E1 to non-light emission state. Accordingly, every pixel having an light emitting element whose opposing electrode is connected to the opposing power source line E1 (pixels on the first line) stops displaying.

The period during which the pixels stops displaying is called a non-display period Td. In the pixels on the first line, the display period Tr1 is ended to start a non-display period Td1 as soon as the opposing power source line E1 is given the OFF opposing electric potential to be kept at that potential. Similar to the case of the display periods, a gap of time is set between the starting points of the non-display periods for the respective lines.

While the opposing power source line E1 is kept at the OFF opposing electric potential, the opposing power source line E2 is then given the OFF opposing electric potential to be kept at that potential. As a result, every pixels having an light emitting element whose opposing electrode is connected to the opposing power source line E2 (pixels on the second line) is brought into non-display state where the pixel stops displaying.

In this way, the opposing power source lines are sequentially given the OFF opposing electric potential until all of them are kept at the potential. The period required to complete giving all the opposing power source lines E1 to Ey OFF opposing electric potential to keep them at the potential and bringing all pixels that have been displaying upon input of the 1 bit digital signal to non-display state is called an erasing period Te1.

On the other hand, the opposing power source line E1 is again given and kept at the ON opposing electric potential as the pixels are brought into non-display state before all of the opposing power source lines E1 to Ey complete receiving the OFF opposing electric potential and are kept at the potential, in other words, before the erasing period Te1 is ended. Then the gate signal line G1 is selected upon input of the gate signal and the 2 bit digital video signal is inputted to the pixels on the first line. As a result, the pixels on the first line begin to display again, thereby ending the non-display period Td1 and starting a display period Tr2.

In the same manner, the opposing power source lines are sequentially given the ON opposing electric potential until all of them are kept at the potential. Thus the gate signal lines are all sequentially selected, so that the 2 bit digital video signal is inputted to all of the pixels. The period required to complete inputting the 2 bit digital video signal to all of the pixels is called a writing period Ta2.

On the other hand, the opposing power source line E1 is given and kept at the OFF opposing electric potential as the 2 bit digital video signal is inputted to the pixels before the input of the 2 bit digital video signal to all of the pixels is completed, in other words, before the writing period Ta2 is ended. This brings all the light emitting elements of the pixels on the first line to non-light emission state and the pixels on the first line stop displaying. The display period Tr2 is thus ended to start a non-display period Td2 in the pixels on the first line.

Then the opposing power source lines are sequentially given the OFF electric potential until all of them are kept at the potential. The period required to complete giving all of the opposing power source lines E1 to Ey the OFF electric potential to keep them at the potential and bringing all the pixels that have been displaying upon input of the 2 bit digital video signal to non-display state is called an erasing period Te2.

The operation described above is repeated until the 5 bits digital video signal is inputted to the pixels. The display period Tr1 of the pixels on the respective lines corresponds to a period which starts as the opposing electrodes of the pixels on the respective lines receive the ON opposing electric potential during the writing period Ta1 so that the digital video signal is written into the pixels on the respective lines and which ends as the opposing electrodes of the pixels on the respective lines receive the OFF opposing electric potential during the erasing period Te1. The non-display period Td1 of the pixels on the respective lines corresponds to a period which starts as the opposing electrodes of the pixels on the respective lines receive the OFF opposing electric potential during the erasing period Te1 and which ends as the opposing electrodes of the pixels on the respective lines receive the ON opposing electric potential during the next writing period (the writing period Ta2, in this case) so that the digital video signal is written into the pixels on the respective lines. The length of the display periods Tr2, Tr3, and Tr4 and the non-display periods Td2, Td3, and Td4 are set in a manner similar to the case of the display period Tr1 and the non-display period Td1.

Next, the opposing power source line E1 is given and kept at the ON opposing electric potential and the 5 bit digital video signal is inputted to the pixels on the first line. Thus the pixels on the first line enter a display period Tr5 to begin displaying. The 5 bit digital video signal is held in the pixels until the next bit digital video signal is inputted. Similarly, the opposing power source lines are sequentially given the ON opposing electric potential until all of them are kept at the potential. Thus the 5 bit digital video signal is inputted to the pixels on all the lines, and the pixels on all the lines enter the display period Tr5 to begin displaying.

The 6 bit digital video signal is next inputted to the pixels on the first line while all of the opposing power source lines are kept at the ON opposing electric potential. Then rewriting takes place and the 5 digital video signal held in the pixels are replaced by the 6 bit digital video signal. The pixels on the first line thus enter a display period Tr6 to begin displaying. The 6 bit digital video signal is held in the pixels until the 1 bit digital video signal of the next frame period is inputted. Similarly, the 6 bit digital video signal is inputted to the pixels on all the lines. The pixels on all the lines thus enter the display period Tr6 to begin displaying.

The 1 bit digital video signal is again inputted to the pixels to start the next frame period, thereby ending the display period Tr6 and simultaneously ending the current frame period. One image can be displayed upon completion of one frame period, which coincides with completion of all the display periods (Tr1 to Tr6). The above operation is repeated in the next frame period.

The display period Tr5 of the pixels on the respective lines corresponds to a period which starts as the opposing electrodes of the pixels on the respective lines receive the ON opposing electric potential so that the digital video signal is written into the pixels on the respective lines and which ends as the opposing electrodes of the pixels on the respective lines receive the ON opposing electric potential during the next writing period (the writing period Ta6, in this case). The display period Tr6 of the pixels on the respective lines corresponds to a period which starts as the opposing electrodes of the pixels on the respective lines receive the ON opposing electric potential so that the digital video signal is written into the pixels on the respective lines and which ends as the opposing electrodes of the pixels on the respective lines receive the ON opposing electric potential during the next writing period (the writing period Ta1 of the next frame period, in this case) so that the digital video signal is written into the pixels on the respective lines.

The length of the display periods Tr must be set so that Tr1:Tr2:Tr5:Tr6=$2^0$:$2^1$: . . . :$2^4$:$2^5$. The desired gray-scale display can then be performed from among $2^6$ gray scales by combining the display periods.

The length of the gray scale displayed by a pixel during one frame period can be set by finding the total sum of the lengths of the display periods during which the light emitting element of the pixel emits light during the one frame period. For example if the luminance for a case in which the pixels emit light during all of the display periods is taken as 100%, then a luminance of 5% can be expressed for a case in which the pixels emit light during Tr1 and Tr2. When the pixels emit light in Tr3 and Tr5, a luminance of 32% can be expressed.

In Embodiment 4, it is vital that the writing period Ta5, in which the number 5 bit of the digital video signal is written to the pixels, be shorter than the length of the display period Tr5.

Further, the display periods (Tr1 to Tr6) may appear in any order. For example, it is possible for the display periods to appear such that Tr3, Tr5, Tr2, . . . , follow after Tr1 within one frame period. However, it is preferable that the erasing periods (Te1 to Te6) are in an order at which they do not mutually overlap. Further, it is preferable that the display periods (Tr1 to Tr6) also are in an order such that they do not mutually overlap.

In the present invention, the gamma value in gamma correction is suppressed to values as low as 2.0 or below (preferably, 1.6 to 1.8). Furthermore, the invention displays $2^n-\alpha$ levels of gray scale ($0<\alpha<2^n$, $\alpha$ is a natural number) with the display device allowing $2^k$ gray scale display ($n<k\leq 2^n$).

That is, a display device of the invention is characterized in that it has display performance of real luminance scale in a bit number greater than the bit number of perceived luminance scale to be outputted in original intention, and the gamma value is suppressed as much as possible to prevent burdens such as costs and power consumption caused by unnecessarily enhancing the display performance of real luminance and to prevent omissions from being generated in gray scales.

Note that present invention can be freely combined with Embodiment Mode, and Embodiments 1 to 3.

Embodiment 5

The order of appearance of the display periods Tr1 to Tr6 in a driving method of the present invention corresponding to a 6 bit digital video signal is explained in Embodiment 5.

Figure 8:
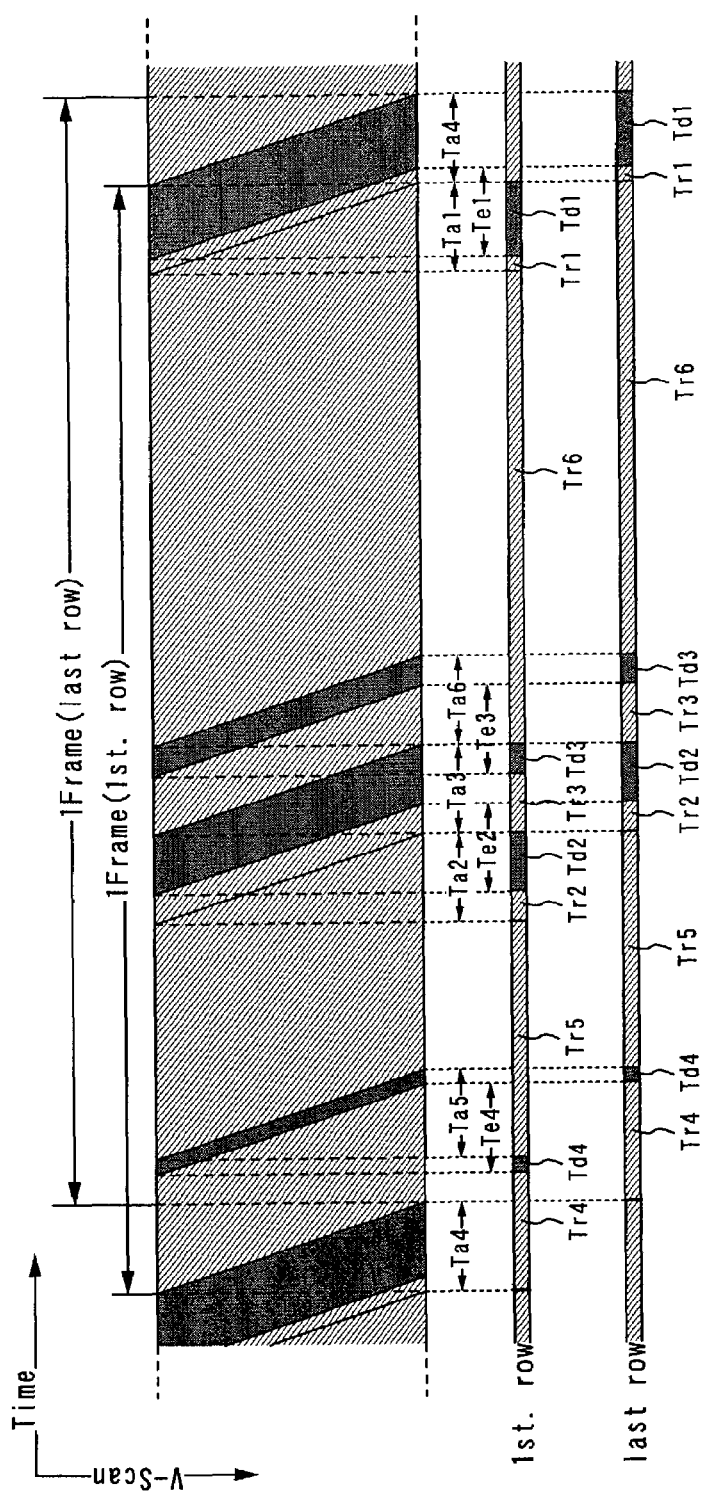
FIG. 8 is a diagram illustrating the method for driving the display device of the invention.

FIG. 8 shows a timing chart for the driving method of Embodiment 5. Embodiment 1 may be referred to for detailed drive of the pixels, and therefore this explanation is omitted here. The longest non-display period (Td1 in Embodiment 5) within one frame period is formed at the end of the one frame period with the driving method of Embodiment 5. It appears to human eyes that there is a separation between the non-display period Td1 and the first display period (Tr4 in Embodiment 5) of the next frame period in accordance with the above structure. Unevenness of display arising due to display periods for emitting light adjoining between adjacent frame periods can thus be made more difficult for human eyes to recognize.

Note that, although a case of a 6 bit digital video signal is explained in Embodiment 5, the present invention is not limited to this. It is possible to implement Embodiment 5 without limiting the number of bits of the digital video signal.

In the present invention, the gamma value in gamma correction is suppressed to values as low as 2.0 or below (preferably, 1.6 to 1.8). Furthermore, the invention displays $2^n-\alpha$ levels of gray scale ($0<\alpha<2^n$, $\alpha$ is a natural number) with the display device allowing $2^k$ gray scale display ($n<k\leq 2^n$).

That is, a display device of the invention is characterized in that it has display performance of real luminance scale in a bit number greater than the bit number of perceived luminance scale to be outputted in original intention, and the gamma value is suppressed as much as possible to prevent burdens such as costs and power consumption caused by unnecessarily enhancing the display performance of real luminance and to prevent omissions from being generated in gray scales.

Note that the present invention can be freely combined with Embodiment Mode, and Embodiments 1 to 4.

Embodiment 6

Figure 9:
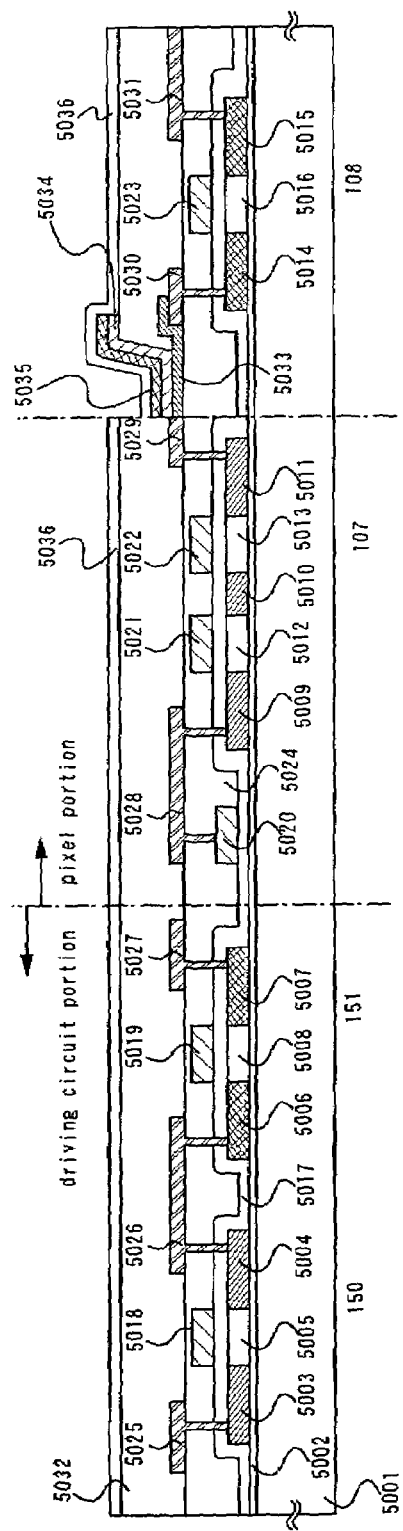
FIG. 9 is a diagram depicting the sectional structure of the display device of the invention.

An outline of a cross sectional structure of a light emitting device of the present invention is explained in Embodiment 6 using FIG. 9. A shown in FIG. 9, an n-channel TFT 150 and p-channel TFT 151 which are basic units are shown as a driver circuit portion, and a switching TFT 107 and a driving TFT 108 which are basic units are shown as a pixel portion in this Embodiment.

In FIG. 9, reference numeral 5001 denotes a substrate, and reference numeral 5002 denotes an insulating film which becomes a base (hereafter referred to as a base film). A light transmitting substrate, typically a glass substrate, a quartz substrate, a glass ceramic substrate, or crystalline glass substrate can be used as the substrate 5001.

Further, the base film 5002 is particularly effective when using a substrate containing mobile ions or a substrate which has conductivity, but the base film 5002 need not be formed on a quartz substrate. An insulating film containing silicon such as a silicon oxide film, a silicon nitride film, and silicon oxynitride film may be used as the base film 5002.

Reference numeral 107 denotes a switching TFT, reference numeral 108 denotes a driving TFT, and both are formed by n-channel TFT and p-channel TFTs respectively. However, the present invention is not limited to the above-mentioned structure. The switching TF1 and the driving TFT may be either n-channel TFTs or p-channel TFTs.

The switching TFT 107 has an active layer containing a source region 5009, a drain region 5011, a separation region 5010, channel forming regions 5012 to 5013, and a gate insulating film 5017, gate electrodes 5021 and 5022, a first interlayer insulating film 5024, a source signal line 5028, a source signal wiring 5020, and a drain wiring 5029.

Furthermore, the switching TFT 107 shown in FIG. 9 is electrically connected to the gate electrodes 5021 and 5022, becoming namely a double gate structure. Not only the double gate structure, but also a multi-gate structure (a structure containing an active layer having two or more channel forming regions connected in series) such as a triple gate structure, may of course also be used. The multi-gate structure is extremely effective in reducing the off current.

The driving TFT 108 has an active layer containing a source region 5015, a drain region 5014, a channel forming region 5016, and a gate insulating film 5017, a gate electrode 5023, a first interlayer insulating film 5024, a source wiring 5031, and a drain wiring 5030.

Further, the drain region 5011 of the switching TFT 107 is connected to the gate electrode 523 of the driving TFT 108. Although not shown in the figure, the gate electrode 523 of the driving TFT 108 is electrically connected to the drain region 5011 of the switching TFT 107 through the drain wiring (also referred to as a connection wiring) 5029, more specifically. The source wiring 5031 of the driving TFT 108 is connected to a power supply line (not shown).

The n-channel TFT 150 has an active layer containing a source region 5003, a drain region 5004, a channel forming region 5005, and a gate insulating film 5017, a gate electrode 5018, a first interlayer insulating film 5024, a source wiring 5025, and a drain wiring 5026.

The p-channel TFT 151 has an active layer containing a source region 5007, a drain region 5006, a channel forming region 5008, and a gate insulating film 5017, a gate electrode 5019, a first interlayer insulating film 5024, a source wiring 5027, and a drain wiring 5026.

The drain region 5004 of the n-channel TFT 150 and the drain region 5006 of the p-channel TFT 151 are electrically connected each other by the drain wiring 5026.

Further, reference numeral 5033 is a pixel electrode (an anode of a light emitting element) made of a transparent conductive film. The pixel electrode 5003 is formed in contact with a drain wiring 5030 of the driving TFT 108.

A second interlayer insulating film 5032 is formed on TFTs such as the n-channel TFT 150, the p-channel TFT 151, the switching TFT 107, and the driving TFT 108.

The second interlayer insulating film 5032 functions as a bank, which includes an opening portion of a taper shape sidewall on the pixel electrode 5033.

A light emitting layer 5034 is provided on the second interlayer insulating film 5032. The light emitting layer 5034 is formed in a single layer structure or a lamination structure by using known light emitting materials.

A cathode 5035 of a light emitting element is formed as an opposing electrode on the light emitting layer 5034. Note that, an element, which is formed by a laminated body of an anode, a light emitting layer, and a cathode is referred to as a light emitting layer, here.

Reference numeral 5036 denotes a passivation film which protects the light emitting layer 5034 from moisture.

Note that the present invention can be freely combined with Embodiment Mode, and Embodiments 1 to 5.

Embodiment 7

In Embodiment 7, an example of manufacturing a light emitting device by using the present invention is described with reference to FIGS. 10A to 10C.

Figure 10A:
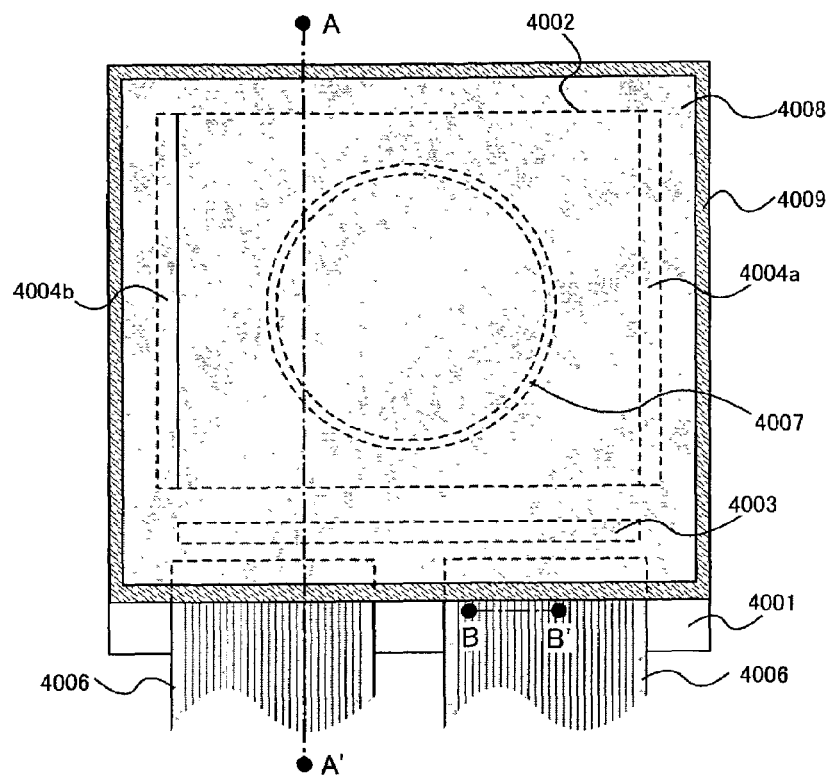
FIGS. 10A to 10C are diagrams depicting the sectional structure of the display device of the invention.
Figure 10B:
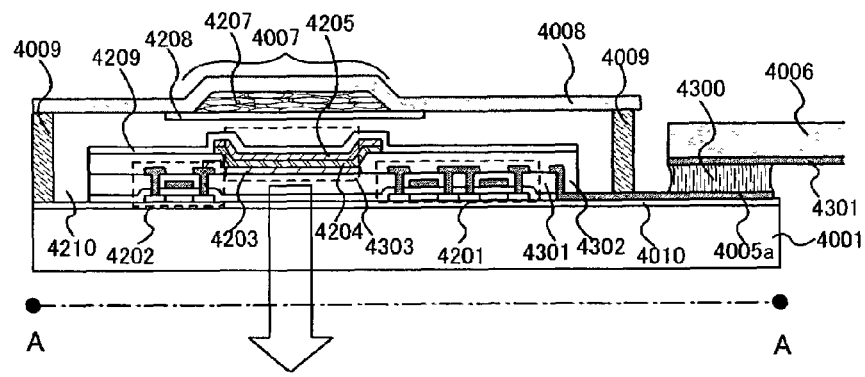

FIG. 10A is a top view of a light emitting device formed by sealing a transistor substrate on which a pixel portion is provided by means of a sealing material. FIG. 10B is a cross sectional view taken along a line A–A' of FIG. 10A, and FIG. 10C is a sectional view taken along a line B–B' of FIG. 10A.

A seal member 4009 is provided so as to surround a pixel portion 4002, a source signal line driving circuit 4003, and a writing gate signal line driving circuit 4004a and an erasing gate signal line driving circuit 4004b, which are provided on a substrate 4001. Further, a sealing member 4008 is provided over the pixel portion 4002, the source signal line driving circuit 4003, and the writing gate signal line driving circuit 4004a and the erasing gate signal line driving circuit 4004b. Thus, the pixel portion 4002, the source signal line driving circuit 4003, and the writing gate signal line driving circuit 4004a and the erasing gate signal line driving circuit 4004b are sealed with a filler 4210 and by the substrate 4001, the seal member 4009, and the sealing member 4008.

Further, the pixel portion 4002, the source signal line driving circuit 4003, and the writing gate signal line driving circuits 4004a and the erasing gate signal line driving circuit 4004b provided on the substrate 4001 include a plurality of TFTs. FIG. 10B typically shows driving TFTs (here, an n-channel TFT and a p-channel TFT are shown) 4201 included in the source signal line driving circuit 4003 and a second TFT (a TFT for controlling current to a light emitting element) included in the pixel portion 4002, which are formed on an base film 4010.

In this embodiment, the p-channel TFT and the n-channel TFT fabricated by a known method are used as the driving TFTs 4201, and a p-channel TFT fabricated by a known method is used as the second TFT 4202. Further, a retention capacitance (not shown), which is connected to a gate of the second TFT 4202 is provided in the pixel portion 4002.

An interlayer insulating film (flattening film) 4301 is formed on the driving TFTs 4201 and the second TFT 4202, and a pixel electrode (anode) 4203 electrically connected to a drain region of the second TFT 4202 is formed thereon. A transparent conductive film having a high work function is used as the pixel electrode 4203. A compound of indium oxide and tin oxide, a compound of indium oxide and zinc oxide, zinc oxide, tin oxide, or indium oxide can be used for the transparent conductive film. Further, the transparent conductive film added with gallium may be used.

An insulating film 4302 is formed on the pixel electrode 4203, and an opening portion is formed in the insulating film 4302 over the pixel electrode 4203. In this opening portion, a light emitting layer 4204 is formed on the pixel electrode 4203. The light emitting layer 4204 is formed by using a known organic light emitting material or inorganic light emitting material by a known evaporation technique or coating technique. Although the organic light emitting material includes a low molecular system (monomer system) and a high molecular system (polymer system), either may be used.

A cathode 4205 made of a conductive film (typically, a conductive film containing aluminum, copper or silver as its main ingredient, or a laminate film of those and another conductive films) having a light shielding property is formed on the light emitting layer 4204. It is desirable that moisture and oxygen existing on the interface between the cathode 4205 and the light emitting layer 4204 are removed to the utmost. Accordingly, it is necessary to make such contrivance that the light emitting layer 4204 is formed in a nitrogen or rare gas atmosphere, and the cathode 4205 is formed while the light emitting layer is not exposed to oxygen or moisture. In this embodiment, a multi-chamber system (cluster tool system) film forming apparatus is used, so that the film formation as described above is enabled. A predetermined voltage is applied to the cathode 4205.

In the manner as described above, an light emitting element 4303 constituted by the pixel electrode (anode) 4203, the light emitting layer 4204, and the cathode 4205 is formed. Then, a protection film 4209 is formed on the insulating film 4302 so as to cover the light emitting element 4303. The protection film 4209 is effective to prevent oxygen, moisture and the like from penetrating into the light emitting element 4303.

Reference numeral 4005a designates a drawing wiring line connected to a power supply line and is electrically connected to a source region of the second TFT 4202. The drawing wiring line 4005a passes between the seal member 4009 and the substrate 4001, and is electrically connected to an FPC wiring line 4301 included in an FPC 4006 through an anisotropic conductive film 4300.

As the sealing member 4008, a glass member, a metal member (typically, a stainless member), a ceramic member, or a plastic member (including a plastic film) can be used. As the plastic member, an FRP (Fiberglass-Reinforced Plastics) plate, a PVF (polyvinyl fluoride) film, a Mylar film, a polyester film or an acryl resin film can be used. Further, a sheet having such a structure that an aluminum foil is interposed between PVF films or Mylar films can also be used.

However, in the case where the radiation direction of light from the light emitting element is directed toward the side of a cover member, the cover member must be transparent. In this case, a transparent material such as a glass plate, a plastic plate, a polyester film, or an acryl film is used.

As the filler 4210, in addition to an inert gas such as nitrogen or argon, ultraviolet ray curing resin or thermosetting resin can be used, and PVC (polyvinyl chloride), acryl, polyimide, epoxy resin, silicone resin, PVB (polyvinyl butyral), or EVA (ethylene-vinyl acetate) can be used. In this embodiment, nitrogen was used as the filler.

Further, in order to expose the filler 4210 to a hygroscopic material (preferably, barium oxide) or a material capable of adsorbing oxygen, a recess portion 4007 is provided on the surface of the sealing member 4008 on the side of the substrate 4001 and the hygroscopic material or the material 4207 capable of adsorbing oxygen is disposed. Then, in order to prevent the hygroscopic material or the material 4207 capable of adsorbing oxygen from scattering, the hygroscopic material or the material capable of adsorbing oxygen are held in the recess portion 4007 by a recess cover member 4208. Note that, the recess cover member 4208 is formed into a fine mesh, and has such a structure that air or moisture is permeated and the hygroscopic material or the material 4207 capable of adsorbing oxygen is not permeated. The deterioration of the light emitting element 4303 can be suppressed by providing therewith the hygroscopic material or the material 4207 capable of adsorbing oxygen.

Figure 10C:
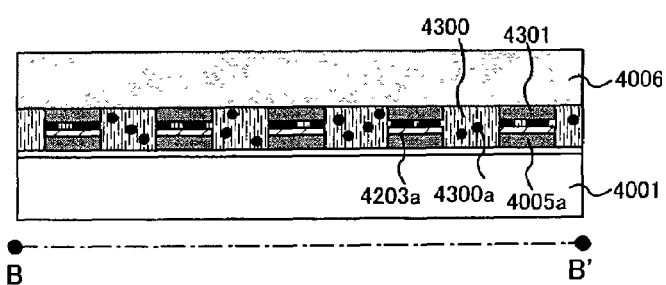

As shown in FIG. 10C, at the same time as the formation of the pixel electrode 4203, a conductive film 4203a is formed to be in contact with the drawing wiring line 4005a.

The anisotropic conductive film 4300 includes a conductive filler 4300a. The substrate 4001 and the FPC 4006 are thermally compressed, so that the conductive film 4203a on the substrate 4001 and the FPC wiring line 4301 on the FPC 4006 are electrically connected through the conductive filler 4300a.

Note that, the present embodiment can be freely combined with Embodiment Mode, and Embodiments 1 to 6.

Embodiment 8

The light emitting device is of the self-emission type, and thus exhibits more excellent recognizability of the displayed image in a light place as compared to the liquid crystal display device. Furthermore, the light emitting device has a wider viewing angle. Accordingly, the light emitting device can be applied to a display portion in various electronic devices.

Such electronic devices using a light emitting device of the present invention include a video camera, a digital camera, a goggles-type display (head mount display), a navigation system, a sound reproduction device (such as a car audio equipment and an audio set), a lap-top computer, a game machine, a portable information terminal (such as a mobile computer, a mobile telephone, a portable game machine, and an electronic book), an image reproduction apparatus including a recording medium (more specifically, an apparatus which can reproduce a recording medium such as a digital versatile disc (DVD) and so forth, and includes a display for displaying the reproduced image), or the like. In particular, in the case of the portable information terminal, use of the light emitting device is preferable, since the portable information terminal that is likely to be viewed from a tilted direction is often required to have a wide viewing angle. FIGS. 11A to 11H respectively shows various specific examples of such electronic devices.

Figure 11A:
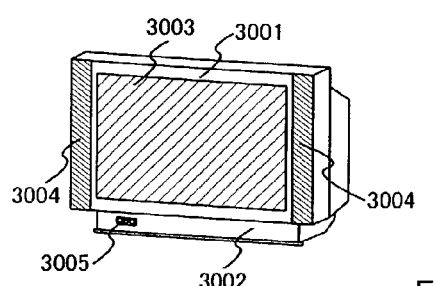
FIGS. 11A to 11H are diagrams of electronic devices provided with the display device of the invention.

FIG. 11A illustrates a light emitting device which includes a casing 3001, a support table 3002, a display portion 3003, a speaker portion 3004, a video input terminal 3005 and the like. The present invention is applicable to the display portion 3003. The light emitting device is of the self-emission-type and therefore requires no backlight. Thus, the display portion thereof can have a thickness thinner than that of the liquid crystal display device. The light emitting device is including the entire display device for displaying information, such as a personal computer, a receiver of TV broadcasting and an advertising display.

Figure 11B:
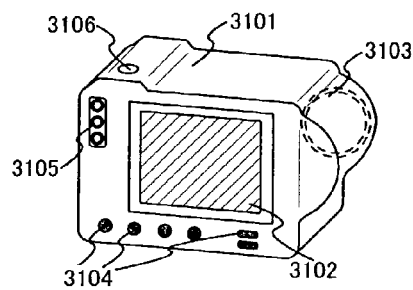

FIG. 11B illustrated a digital still camera which includes a main body 3101, a display portion 3102, an image receiving portion 3103, an operation key 3104, an external connection port 3105, a shutter 3106, and the like. The light emitting device of the present invention can be used as the display portion 3102.

Figure 11C:
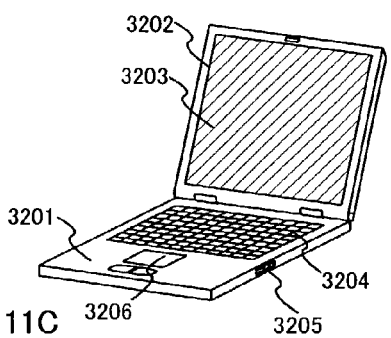

FIG. 11C illustrates a lap-top computer which includes a main body 3201, a casing 3202, a display portion 3203, a keyboard 3204, an external connection port 3205, a pointing mouse 3206, and the like. The light emitting device of the present invention can be used as the display portion 3203.

Figure 11D:
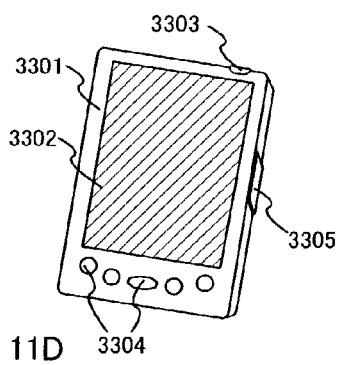

FIG. 11D illustrated a mobile computer which includes a main body 3301, a display portion 3302, a switch 3303, an operation key 3304, an infrared port 3305, and the like. The light emitting device of the present invention can be used as the display portion 3302.

Figure 11E:
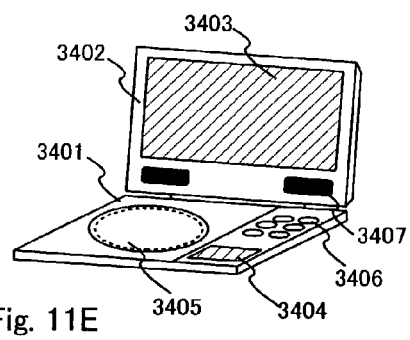

FIG. 11E illustrates a portable image reproduction apparatus including a recording medium (more specifically, a DVD reproduction apparatus), which includes a main body 3401, a casing 3402, a display portion A 3403, another display portion B 3404, a recording medium (DVD or the like) reading portion 3405, an operation key 3406, a speaker portion 3407 and the like. The display portion A 3403 is used mainly for displaying image information, while the display portion B 3404 is used mainly for displaying character information. The light emitting device of the present invention can be used as these display portions A 3403 and B 3404. The image reproduction apparatus including a recording medium further includes a domestic game machine or the like.

Figure 11F:
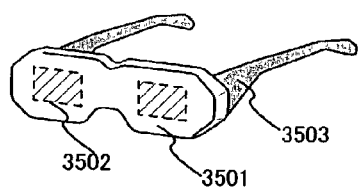

FIG. 11F illustrates a goggle type display (head mounted display) which includes a main body 3501, a display portion 3502, arm portion 3503, and the like. The light emitting device of the present invention can be used as the display portion 3502.

Figure 11G:
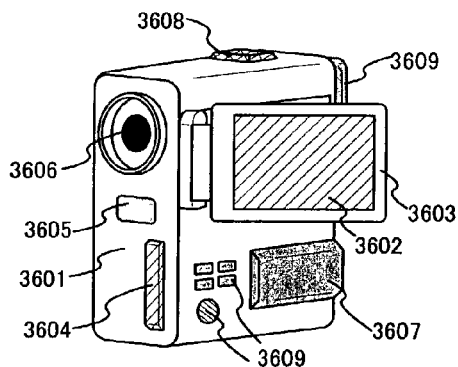

FIG. 11G illustrates a video camera which includes a main body 3601, a display portion 3602, a casing 3603, an external connecting port 3604, a remote control receiving portion 3605, an image receiving portion 3606, a battery 3607, a sound input portion 3608, an operation key 3609, and the like. The light emitting device of the present invention can be used as the display portion 3602.

Figure 11H:
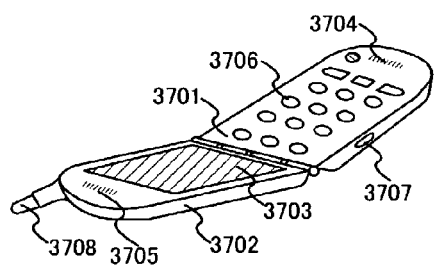
Figure 12A:
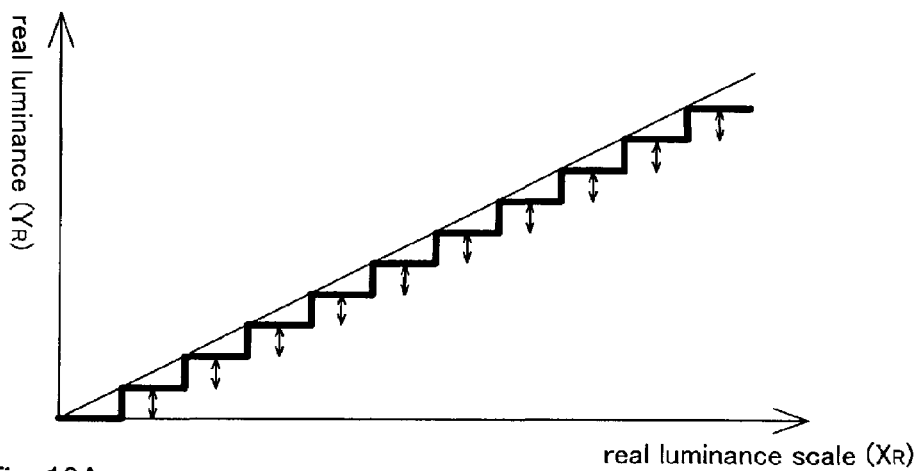
FIGS. 12A to 12C are diagrams of graphs depicting the relationship between the gray scale and the luminance, and between the gray scale and the perceived luminance.
Figure 12B:
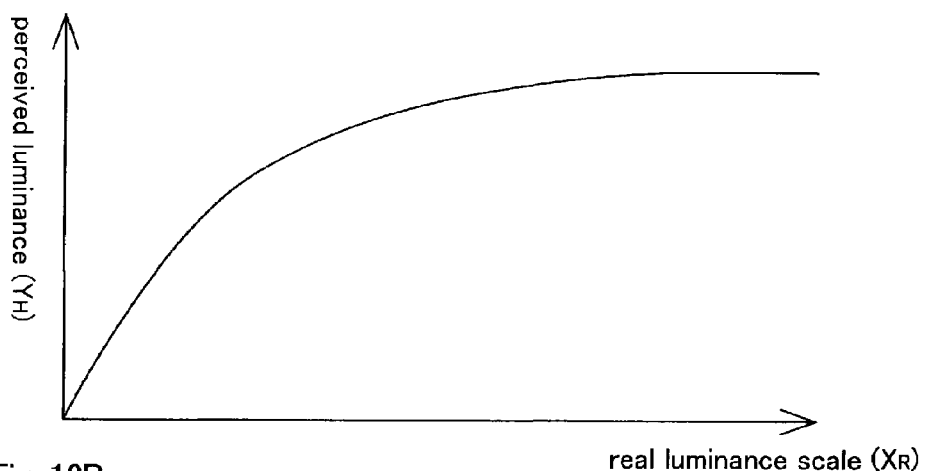
Figure 12C:
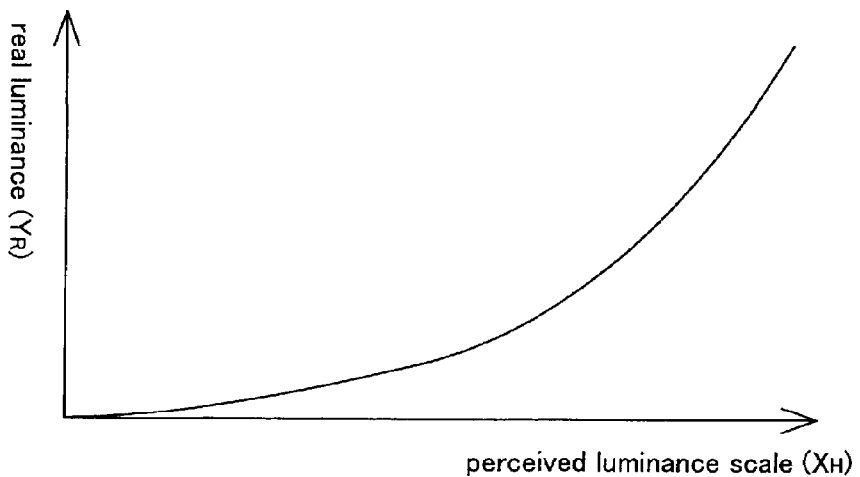
Figure 13:
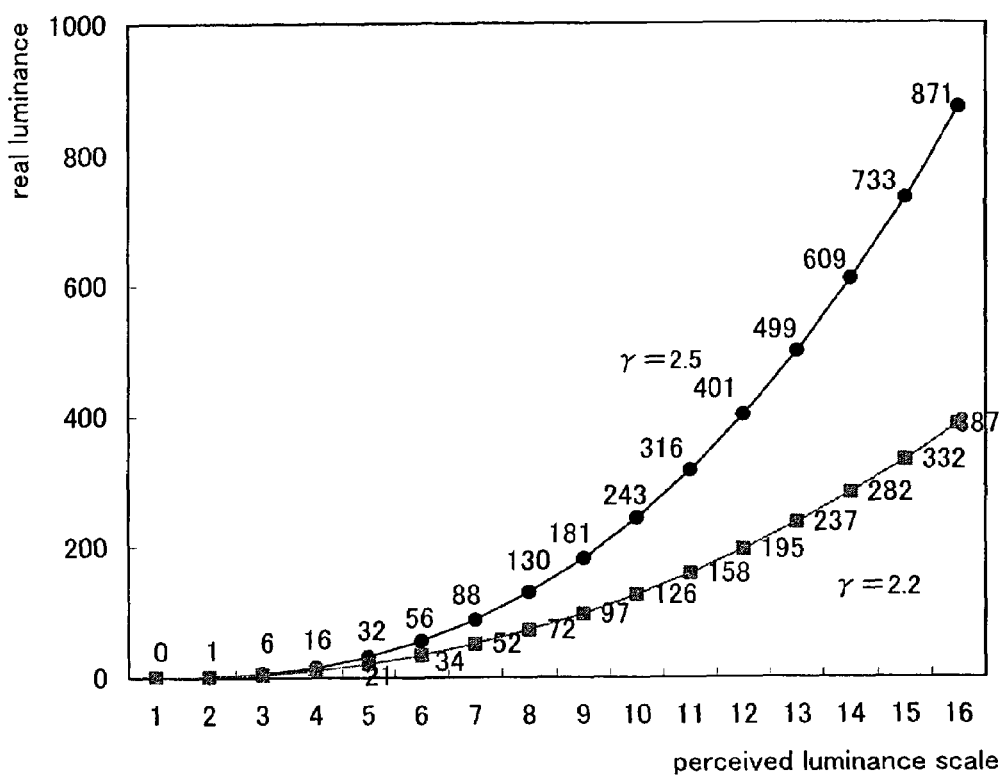
FIG. 13 is a diagram of a graph depicting the relationship between the gray scale and the luminance.

FIG. 11H illustrates a mobile telephone which includes a main body 3701, a casing 3702, a display portion 3703, a sound input portion 3704, a sound output portion 3705, an operation key 3706, an external connecting port 3707, an antenna 3708, and the like. The light emitting device of the present invention can be used as the display portion 3703. Note that the display portion 3703 can reduce power consumption of the mobile telephone by displaying white-colored characters on a black-colored background.

When the brighter luminance of light emitted from the organic light emitting material becomes available in the future, the light emitting device in accordance with the present invention will be applicable to a front-type or rear-type projector in which light including output image information is enlarged by means of lenses or the like to be projected.

The aforementioned electronic devices are more likely to be used for display information distributed through a telecommunication path such as Internet, a CATV (cable television system), and in particular likely to display moving picture information. The light emitting device is suitable for displaying moving pictures since the organic light emitting material can exhibit high response speed.

A portion of the light emitting device that is emitting light consumes power, so it is desirable to display information in such a manner that the light-emitting portion therein becomes as small as possible. Accordingly, when the light emitting device is applied to a display portion which mainly displays character information, e.g., a display portion of a portable information terminal, and more particular, a portable telephone or a sound reproduction device, it is desirable to drive the light emitting device so that the character information is formed by a light-emitting portion while a non-emission portion corresponds to the background.

As set forth above, the present invention can be applied variously to a wide range of electronic devices in all fields. Moreover, the electronic device in this embodiment can be implemented by using any structure of the light emitting devices in Embodiment Mode, and Embodiments 1 to 7.

In the invention, the gamma value in gamma correction is suppressed to such values as low as 2.0 or below (preferably 1.6 to 1.8). Furthermore, the invention displays $2^n$ $\alpha$ levels of gray scale ($0<\alpha<2^n$, $\alpha$ is a natural number) with the display device allowing $2^k$ gray scale display ($n<k\leq2^n$).

Consequently, the display device of the invention has the display performance of real luminance scale in a greater bit number than the bit number of perceived luminance scale to be outputted in original intention, and the gamma value is suppressed as much as possible. Thus, burdens such as costs and power consumption due to unnecessary enhancement of the display performance of real luminance can be prevented, and omissions can be prevented from being generated in gray scales.

What is claimed is:

1. A method for driving a display device having a gamma correction circuit for correcting a video signal at a gamma value of 2.0 or below and a plurality of pixels disposed with a light emitting element, a driving TFT for controlling drive of the light emitting element, a switching TFT for controlling drive of the driving TFT, and an erasing TF1, the method comprising:

inputting a digital video signal to the plurality of pixels in n write periods Ta1, Ta2, . . . and Tan while the switching TFT is held in ON-state;

selecting to light or not to light the pixel by the digital video signal in display periods Tr1, Tr2, . . . and Trn; and erasing the digital video signal inputted to the plurality of pixels in erase times Te1, Te2, . . . and Te(m−1) while the erasing TFT is held in an ON-state, wherein one frame period has the n write periods Ta1, Ta2, . . . and Tan, and the (m−1) erase times Te1, Te2, . . . and Te(m−1) (m is an arbitrary number from 2 to n), among the n write periods Ta1, Ta2, . . . and Tan, the write periods Ta1, Ta2, . . . and Tam are overlapped with the erase times Te1, Te2, . . . and Te(m−1) each other, respectively, a period of time to start each of the (m−1) erase times Te1, Te2, . . . and Te(m−1) after having started each of the write periods Ta1, Ta2, . . . and Tan is the display periods Tr1, Tr2, . . . and Tr(m−1), a ratio of lengths of the display periods Tr1, Tr2, . . . and Trn is expressed by $2^0:2^1: \ldots 2^{(n-1)}$, and a period of time to start each of the n write periods Ta1, Ta2, . . . and Tan after having started each of the (m−1) erase times Te1, Te2, . . . and Te(m−1) is non-display periods Td1, Td2, and Tdn.

2. A method for driving a display device having a gamma correction circuit for correcting a video signal at a gamma value of 2.0 or below, and a plurality of pixels disposed with a light emitting element, a driving TFT for controlling drive of the light emitting element, and a switching TFT for controlling drive of the driving TFT, the method comprising:

inputting the video signal to the plurality of pixels in n write periods Ta1, Ta2, . . . and Tan while the switching TFT is held in ON-state; and selecting to light or not to light the pixel by the video signal in display periods Tr1, Tr2, . . . and Trn, wherein one frame period has the n write periods Ta1, Ta2, . . . and Tan, and (m−1) erase times Te1, Te2, . . . and Te(m−1) (m is an arbitrary number from 2 to n), among the n write periods Ta1, Ta2, . . . and Tan, the write periods Ta1, Ta2, . . . and Tam are overlapped with the erase times Te1, Te2, . . . and Te(m−1) each other, respectively, a period of time to start each of the (m−1) erase times Te1, Te2, . . . and Te(m−1) after having started each of the write periods Ta1, Ta2, . . . and Tan is the display periods Tr1, Tr2, . . . and Tr(m−1), a ratio of lengths of the display periods Tr1, Tr2, . . . and Trn is expressed by $2^0:2^1: \ldots 2^{(n-1)}$, and a period of time to start each of the n write periods Ta1, Ta2, . . . and Tan after having started each of the (m−1) erase times Te1, Te2, . . . and Te(m−1) is non-display periods Td1, Td2, . . . and Tdn.

3. A method for driving a display device having a gamma correction circuit for correcting a video signal at a gamma value of 2.0 or below and a pixel part including a plurality of pixels disposed with a light emitting element, the method comprising:

inputting the video signal to the plurality of pixels in write periods Ta1, Ta2, . . . and Tan; and selecting to light or not to light the pixel by the video signal in display periods Tr1, Tr2, . . . and Trn, wherein one frame period has the n write periods Ta1, Ta2, . . . and Tan, and (m−1) erase times Te1, Te2, . . . and Te(m−1) (m is an arbitrary number from 2 to n), among the n write periods Ta1, Ta2, . . . and Tan, the write periods Ta1, Ta2, . . . and Tam are overlapped with the erase times Te1, Te2, . . . and Te(m−1) each other, respectively, a period of time to start each of the (m−1) erase times Te1, Te2, . . . and Te(m−1) after having started each of the write periods Ta1, Ta2, . . . and Tan is the display periods Tr1, Tr2, . . . and Tr(m−1), a ratio of lengths of the display periods Tr1, Tr2, . . . and Trn is expressed by $2^0:2^1: \ldots 2^{(n-1)}$, and a period of time to start each of the n write periods Ta1, Ta2, . . . and Tan after having started each of the (m−1) erase times Te1, Te2, . . . and Te(m−1) is non-display periods Td1, Td2, . . . and Tdn.

\* \* \* \* \*